(12) United States Patent
Hongo et al.

(10) Patent No.: US 7,326,623 B2
(45) Date of Patent: Feb. 5, 2008

(54) METHOD OF MANUFACTURING DISPLAY DEVICE

(75) Inventors: Mikio Hongo, Yokohama (JP); Sachio Uto, Yokohama (JP); Mineo Nomoto, Yokohama (JP); Toshihiko Nakata, Hiratsuka (JP); Mutsuko Hatano, Kokubunji (JP); Shinya Yamaguchi, Mitaka (JP); Makoto Ohkura, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 318 days.

(21) Appl. No.: 11/209,742

(22) Filed: Aug. 24, 2005

(65) Prior Publication Data

US 2006/0003478 A1  Jan. 5, 2006

Related U.S. Application Data

(63) Continuation of application No. 10/267,680, filed on Oct. 10, 2002, now Pat. No. 6,943,086.

(30) Foreign Application Priority Data

Oct. 10, 2001  (JP) .............................. 2001-312113

(51) Int. Cl.
   *H01L 21/336* (2006.01)
   *H01L 23/58* (2006.01)
(52) U.S. Cl. ...................................... 438/308; 438/488
(58) Field of Classification Search ............... 438/308, 438/488, 660, 764; 257/50–57, E51.009
See application file for complete search history.

(56) References Cited

U.S. PATENT DOCUMENTS

| 3,789,653 A | 2/1974 | Brejaud |
| 4,854,669 A | 8/1989 | Birnbach et al. |
| 5,245,626 A | 9/1993 | Burke et al. |
| 5,508,489 A | 4/1996 | Benda et al. |
| 5,706,076 A | 1/1998 | Takeda |

(Continued)

FOREIGN PATENT DOCUMENTS

JP   2001-44120   2/2001

(Continued)

OTHER PUBLICATIONS

F. Takeuchi, et al., "Performance of poly-Si TFTs fabricated by a Stable Scanning CW Lase Crystallization", AM-LCD'01, pp. 251-254.

*Primary Examiner*—Calvin Lee
(74) *Attorney, Agent, or Firm*—Antonelli, Terry, Stout & Kraus, LLP.

(57) ABSTRACT

Arrangements (e.g., methods) for manufacturing a display device, including irradiating an amorphous semiconductor film formed on a substrate with an excimer laser beam to convert the amorphous semiconductor film into a polycrystalline semiconductor film; and irradiating predetermined areas of the polycrystalline semiconductor film intermittently with a continuous wave laser beam while a position of the substrate with respect to the continuous wave laser beam is scanned, crystal grains larger than those of the polycrystalline semiconductor film other than the predetermined areas are formed in each of the predetermined areas locally in the polycrystalline semiconductor film, wherein first thin film transistors are formed in the predetermined areas while second thin film transistors are formed in the polycrystalline semiconductor film other than the predetermined areas thereof.

17 Claims, 18 Drawing Sheets

U.S. PATENT DOCUMENTS

| | | |
|---|---|---|
| 5,832,013 A | 11/1998 | Yessik et al. |
| 6,122,419 A | 9/2000 | Kurokawa et al. |
| 6,295,262 B1 | 9/2001 | Kusumoto et al. |
| 6,388,799 B1 | 5/2002 | Arnone et al. |
| 6,485,703 B1 | 11/2002 | Cote et al. |
| 6,621,571 B1 | 9/2003 | Maeda et al. |
| 6,697,408 B2 | 2/2004 | Kennedy et al. |
| 6,707,838 B2 | 3/2004 | Tani et al. |
| 6,949,419 B2 * | 9/2005 | Shiba et al. ............ 438/149 |
| 6,949,452 B2 * | 9/2005 | Hatano et al. ............ 438/488 |
| 2002/0105997 A1 | 8/2002 | Zhang |
| 2004/0027645 A1 | 2/2004 | Ishihara |

FOREIGN PATENT DOCUMENTS

| | | |
|---|---|---|
| JP | 2002-0031876 | 3/2002 |
| JP | 2002-0119609 | 8/2002 |
| JP | 2002-222959 | 8/2002 |

* cited by examiner $T = (1 - R)^4$ $T = (1 - R)^{12}$

ENERGY DISTRIBUTION WHEN PROJECTING A COHERENT BEAM

LASER IRRADIATED REGION

LASER IRRADIATED REGION

METHOD OF MANUFACTURING DISPLAY DEVICE

CROSS-REFERENCE TO RELATED APPLICATION

This application is a continuation application of application Ser. No. 10/267,680, filed Oct. 10, 2002 now U.S. Pat. No. 6,943,086 the contents of which are incorporated herein by reference in their entirety.

BACKGROUND OF THE INVENTION

The present invention relates to a laser annealing method and laser annealing apparatus, which are capable of providing an improvement in the film qualities, the crystal grain enlargement, or single-crystallization of an amorphous or polycrystalline semiconductor film that is formed on an insulating substrate through laser beam irradiation; and, more particularly, the invention relates to a TFT device that is manufactured through laser annealing and to a display apparatus provided with such a TFT device.

Currently, images are produced on liquid crystal panels by switching thin film pixel transistors that are formed with an amorphous or polycrystalline silicon film on a substrate of glass or fused quartz. Significant reductions in production costs and improvements in reliability could be expected if it were possible to form a driver circuit, for driving the pixel transistor, on the substrate at the same time.

However, because the silicon film forming the active layer of the transistors has a poor crystalline, the capacity of thin film transistors, as represented by the mobility, is low, and the manufacture of circuits for which high speeds and high-performance are required is difficult. A high mobility thin film transistor is required in order to manufacture these high-speed, high performance circuits; and, in order to realize this, improvements in the crystallinity of the silicon thin film are necessary.

Excimer laser annealing has, in the past, attracted attention as a method for improving the crystallinity. In this method, the mobility is improved by changing the amorphous silicon film to a polycrystalline silicon film, and this is accomplished by irradiating an excimer laser on an amorphous silicon film, that is formed on an insulating substrate Of glass or the like. However, the polycrystalline film attained by excimer laser irradiation has crystal grain sizes of only several hundred nanometers. Thus, the film does not have a sufficient performance to be used as part of a driver circuit or the like for driving a liquid crystal panel.

In order to resolve this issue, Japanese Patent Laid-open Application No. 2001-44120 discloses a method wherein the crystal grain sizes are increased by irradiation with an ultraviolet pulsed laser, such as an excimer laser, for example, which serves as a first pulsed laser, followed by irradiation with a pulsed laser in the visible light range, which serves as a second pulsed laser. This method is designed to increase the crystal grain sizes by extending the re-crystallization time with the radiation of the second pulsed laser within 200 nanoseconds of irradiation with the first pulse laser.

SUMMARY OF THE INVENTION

In the abovementioned method, as disclosed in Application No. 2001-44120, the harmonics of a Q-switched oscillating solid-state laser, with an Nd ion-doped or Yb ion-doped crystal or glass excitation medium, is used as the second pulsed laser: Nd:YAG laser, Nd:YLF laser, Yb:YAG laser, Nd:glass laser, or Yb:glass laser.

However, the pulse duration of these lasers is several dozen to several hundred nanoseconds, and the extension of the re-crystallization time is limited Specifically the crystal grain sizes attained are about one micron, and so there is still not sufficient capacity for application as a driver circuit or the like for driving a liquid crystal panel. Also, an attenuator and linear beam-forming optical system are disclosed as the optical system for irradiating the second pulsed laser in the abovementioned Application No. 2001-44120, but the following problems remain in spite of the use of this mechanism.

The first problem is that the output of the Q-switched oscillating pulse changes in terms of time in the form of a sine wave, and so a pulse duration and a change in output in terms of time, which are optimal for annealing, cannot be attained.

The second problem is, that the energy distribution of the abovementioned laser is a Gaussian distribution. In this state, the uniform energy distribution necessary for laser annealing, or the energy distribution optimal for annealing, can not be attained.

Furthermore, there is a third problem in that a laser beam from a solid-state laser, such as an Nd:YAG laser, has high coherency. Irregularities occur in the energy density distribution in the irradiated area as a result of the influence of interference.

It is an object of the present invention to resolve the abovementioned problems and to provide a laser annealing method and laser annealing apparatus that are optimal for the annealing of an amorphous or polycrystalline silicon thin film, having an energy distribution appropriate for laser annealing in the irradiated area without the influence of interference, wherein the optimal temporal energy changes are attained in laser annealing with an optimal pulse duration; and it is an object to provide a TFT device manufactured through laser annealing.

In order to achieve the abovementioned objects, the laser annealing method of the present invention radiates a laser beam that is processed by the following means. Firstly, an oscillator, which produces a continuous wave beam, is used as the laser oscillator in order to realize the desired pulse duration and desired temporal, energy changes. The continuous wave laser beam is pulsed, and the preferred change in terms of time for the energy of the pulsed laser beam is attained with time varying means, such as an electro-optical modulator or acoustic-optical modulator.

Secondly, the coherency of the laser beam having a coherency is eliminated or reduced with an incoherent optical system, and the influence of interference on the laser-irradiated area is reduced or eliminated.

Thirdly, a beam-homogenizer and rectangular slit are used to provide a uniform energy distribution across the entire surface of the irradiated area; and, a filter having a desired transmittance distribution is provided in order to achieve a specific distribution. A laser beam, for which a uniform or desired energy distribution is attained, is irradiated on an amorphous or polycrystalline silicon film as a projected image of the rectangular slit image with an objective lens.

Also, in order to achieve the abovementioned object, the laser annealing apparatus relating to the present invention comprises: a laser oscillator outputting a continuous wave beam; means for modulating the laser beam in terms of time; a beam-homogenizer; an incoherent optical system; a, filter having a desired transmittance distribution; a rectangular slit; and an objective lens.

Furthermore, the TFT device relating to the present invention is attained by performing the abovementioned laser annealing method relating to the present invention with the abovementioned laser annealing apparatus relating to the present invention.

BRIEF DESCRIPTION OF THE DRAWINGS

These and other features, objects and advantages of the present invention will become more apparent from the following description when taken in conjunction with the accompanying drawings, wherein.

DESCRIPTION OF THE PREFERRED EMBODIMENTS

Figure 1:
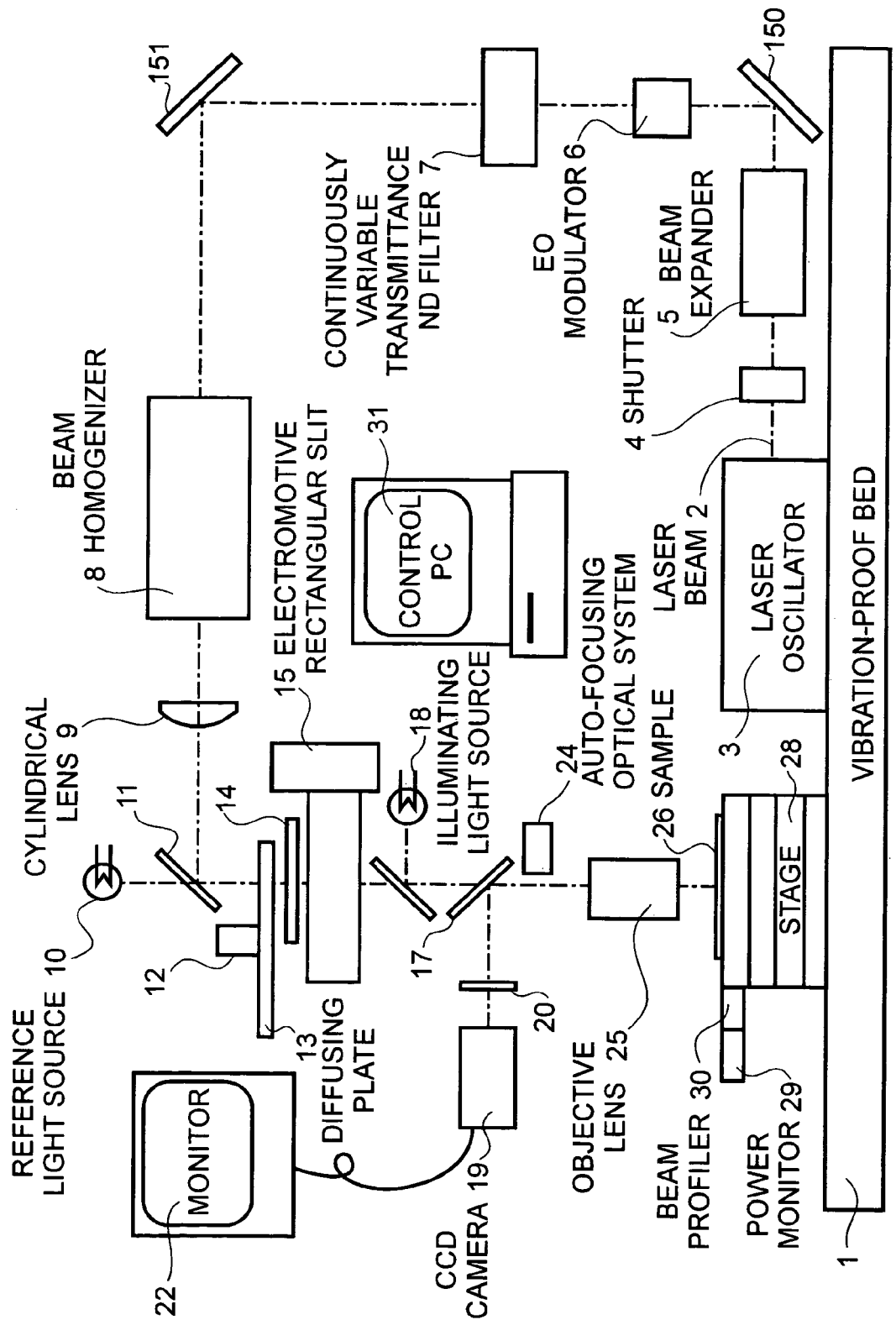
FIG. 1 is a block diagram showing the constitution of the laser annealing apparatus relating to a first embodiment.

A detailed explanation of the present invention will be presented with reference to the drawings. FIG. 1 is a diagram showing the constitution of the laser annealing apparatus relating to the first embodiment of the present invention, the base of which is constituted by a bed 1, which is provided with a vibration proofing mechanism (not shown). The bed 1 serves as a support for a laser oscillator 3 for emitting a continuous wave laser beam 2, a shutter 4 for turning the laser beam 2 on and off, a beam expander 5 for expanding the beam diameter of the laser beam 2 that is output from the laser oscillator 3, an electro-optical modulator. (hereinafter "EO modulator") 6 for effecting a pulsing and temporal modulation of the energy of the laser beam 2, a continuously variable transmittance ND filter 7 for regulating the energy of the laser beam 2, a beam-homogenizer 8 for giving the laser beam 2 a uniform energy distribution, and a cylindrical lens 9 for compressing the laser beam 2 in one direction and forming a linear beam.

There is also a reference light source 10 for confirming the radiation area and radiation form of the laser beam 2, a dichroic mirror 11 having the property of transmitting the wavelength from the reference light source 10 and reflecting the laser beam 2, a diffusing plate 13 which is driven by a high-speed rotary driving apparatus 12, a filter 14 for providing the desired form to the energy density distribution in the irradiated surface, and a rectangular slit 15 for eliminating the spillover portion of the laser beam 2 and forming the given rectangular form. A mirror 17 is provided for combining the illuminating beam, the laser beam 2, and the reference beam.

There is also an illuminating light source 18 used during Observation, a CCD camera 19, a laser cut filter 20 for preventing the laser beam from irradiating on the CCD camera 19, a monitor 22 for displaying the sample surface imaged by the CCD camera 19, an auto-focusing optical system 24 for detecting the focal position and outputting a signal in the case of deviation from the focal position, and an objective lens 25 used in observation and for concentrating the laser beam 2.

A stage 28 is provided for supporting the sample 26 and moving the sample in X, Y, Z and ? directions, and a power monitor 29 is fixed on the stage 28 for measuring the output of the laser beam 2, along with a beam profiler 30 for measuring, the two dimensional energy distribution of the laser beam 2. A control PC (control apparatus) 31 is provided for controlling the stage 28, the laser oscillator 3, the shutter 4, the EO modulator 6, the continuously variable transmittance filter 7, the electromotive rectangular slit 15, a Z stage according to a signal from the auto-focusing optical system 24, and an image processing unit and the like (not shown).

Next, the operation and functions of each of the above-described elements will be explained in detail. The bed 1 is preferably provided with a vibration proofing mechanism (not shown) using an air spring in order to dampen vibrations from the floor. The vibration proofing mechanism may be unnecessary depending on the environment where the apparatus is installed. Sufficient strength and rigidity are provided by the bed 1 for supporting the stage 28 and the various optical systems.

The continuous wave laser beam 2 preferably has a wavelength that is absorbed by the amorphous or polycrystalline silicon thin film which is subject to annealing, specifically a wavelength in the range from the ultraviolet to the visible wavelengths. More specifically, the following may be applied: an Ar laser or Kr laser and the second harmonics thereof, and the second and third harmonics of an Nd:YAG laser, Nd:YVO$_4$ laser, and Nd:YLF laser. However, in consideration of the magnitude and stability of the output, the second harmonics (wavelength 532 nm) of an LD (laser diode) pumped Nd:YAG laser or the second harmonics (wavelength 532 nm) of a laser diode pumped Nd:YVO$_4$ laser are preferable. The following explanation concerns an example using the second harmonics of the LD pumped Nd:YVO$_4$ laser, which has a high output power and superior stability and low noise properties.

The laser beam 2 that is oscillated from the laser oscillator 3 is switched on and off using the shutter 4. Specifically, the laser oscillator 3 is placed in a state of continually oscillating the laser beam 2 at a constant output; and the shutter 4 is normally off so that the laser beam 2 is blocked by the shutter 4. This shutter 4 is opened (on state) only when the laser beam 2 is to be output. It is possible to turn the laser beam on and off by turning a pumping laser diode on and off, but this is not desirable from the point of view of ensuring the stability of the laser output. In addition, from the point of view of safety, the shutter 4 may be closed when the radiation of the laser beam 2 is to be stopped.

The laser beam 2, which passes through the shutter 4, has its beam diameter expanded by the beam expander 5, and then it strikes the EO modulator 6. In consideration of the damage threshold of the EO modulator 6, the beam diameter is expanded by the beam expander 5 up to a size approaching the effective diameter of the EO modulator 6. When the beam diameter of the laser beam 2 that is output from the laser oscillator 3 is about 2 mm and the effective diameter of the EO modulator 6 is 15 mm, the expansion factor of the beam expander 5 is about 6. Of course, the beam expander 5 need not be used when the damage threshold of the EO modulator 6 is sufficiently high to allow direct irradiation by the laser beam 2 from the laser oscillator 3.

Figure 2:
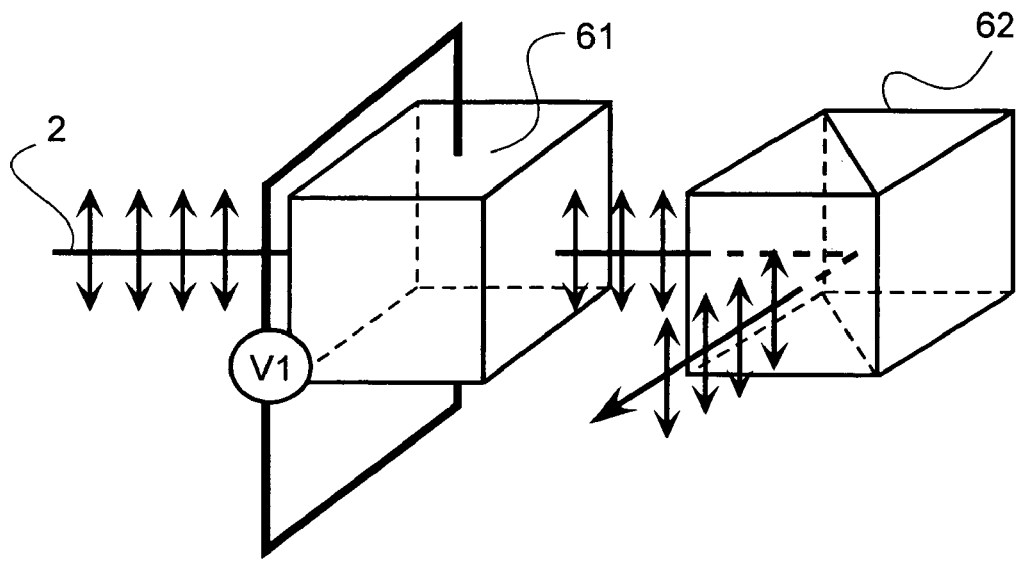
FIG. 2 is a diagrammatic perspective view of an EO modulator used in the first embodiment.
Figure 3:
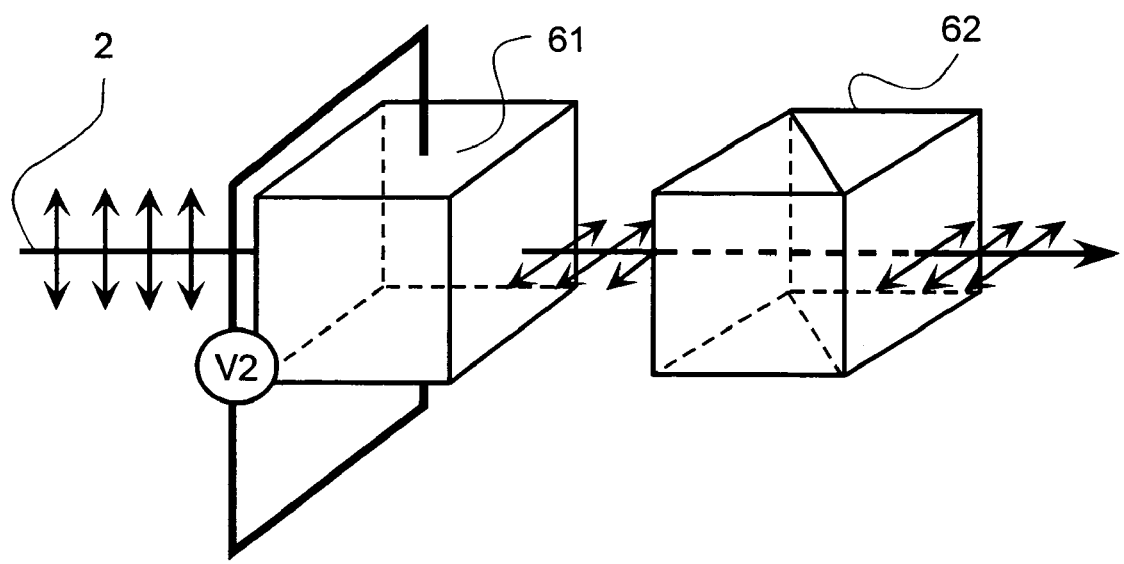
FIG. 3 is a diagrammatic perspective view of the EO modulator used in the first embodiment.

As shown in FIGS. 2 and 3, the EO modulator 6 uses a combination of a Pockels cell 61 (hereinafter "crystal") and a polarized beam splitter 62. In the case where the laser beam 2 is a linearly polarized beam, as shown in FIG. 2, the laser beam 2 strikes the polarized beam splitter 62 as an S polarized beam and, is deflected 90 degrees, without effecting rotation of the polarization direction of the laser beam 2 which passes through the crystal 61, when the voltage V1 (normally a voltage of 0 V) is applied through, a driver (not shown) to the crystal 61. Specifically, in this state, the laser beam 2 is in an off state and does not reach the downstream optical systems, because the laser beam 2 is output at a deflection angle of 90 degrees.

Next, as shown in FIG. 3, with the application of the voltage V2, which will cause the rotation by 90 degrees of the polarization direction of the laser beam 2 transmitted by the crystal 61, the laser beam 2 reaches the polarized beam splitter 62 as a P polarized beam, and so the laser beam 2 undergoes rectilinear propagation through the polarized beam splitter 62. Specifically, in this state, the laser beam 2 is in an on state and undergoes rectilinear propagation to the downstream optical systems.

Figure 4:
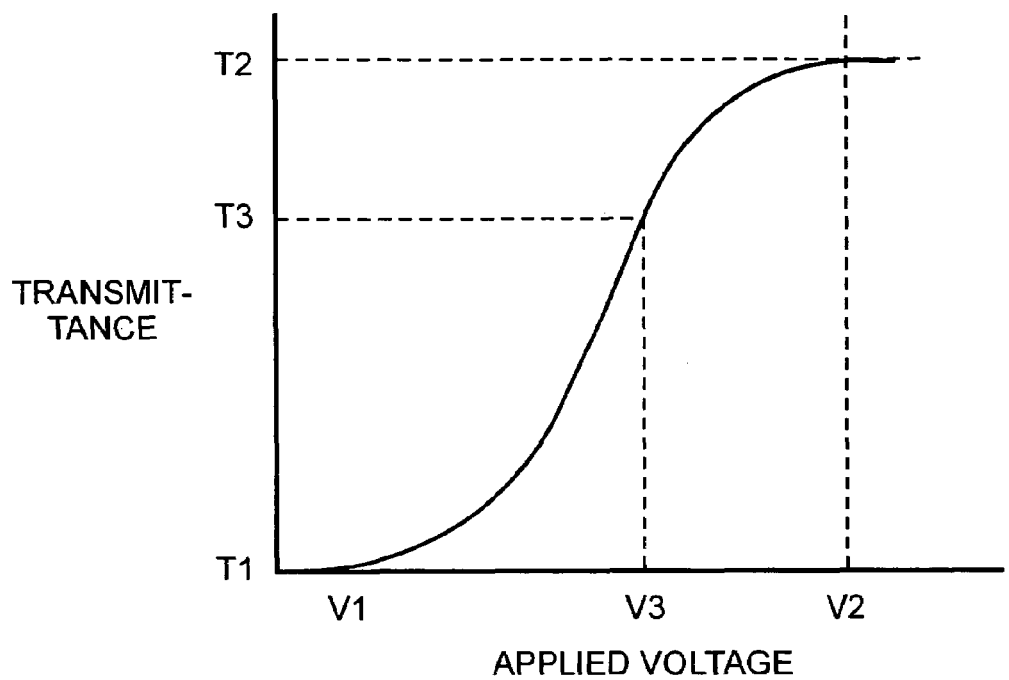
FIG. 4 is a graph showing the relationship between the applied voltage and transmittance in the EO modulator.

Furthermore, as shown in FIG. 4, by regulating the voltage applied to the crystal 61 between V1 (normally 0 V) and V2, the transmittance of the laser beam 2 that is transmitted by the EO modulator 6 can be regulated as desired between T1 (normally 0) and T2 (this is the maximum transmittance, specifically 1). In other words, the transmittance of the laser beam 2 transmitted by the EO modulator 6 can be regulated as desired in a range from 0 to 1. However, it is assumed here that there is no reflection or absorption by the surfaces of the crystal 61 and polarized beam splitter 62.

Figure 5:
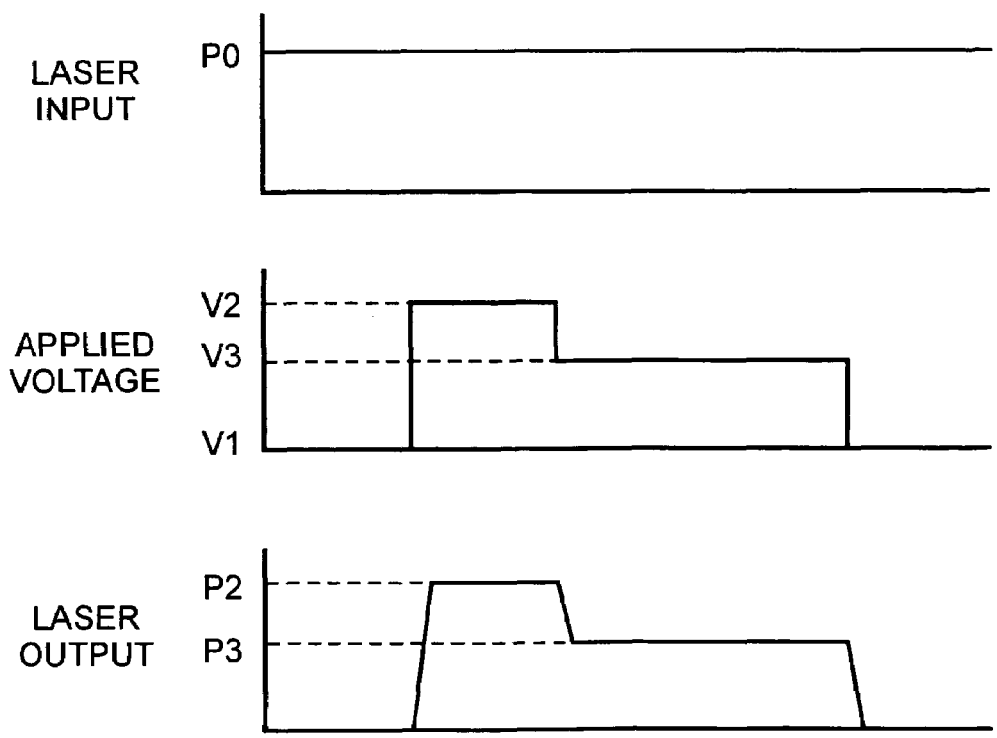
FIG. 5 is a graph showing the relationship between the laser input, applied voltage, and laser output in the EO modulator.

Because of this, as shown in FIG. 5, the output of the laser beam 2 striking the EO modulator 6 (input to the EO modulator 6) is uniformly P0. By applying a stepped voltage to the crystal 61 between V1, V2, V3, and V1, a stepped output of P2 and P3 is attained from the EO modulator 6. Here, the output P2 is the product of the input P0 to the EO modulator 6 and the transmittance T2, when the voltage V2 is applied; and P3 is the product of P0 and the transmittance T3, when the voltage V3 is applied.

The output of the transmitted laser beam 2 can be continually varied by continually changing the voltage applied to the crystal 61. As a result, it becomes possible to attain a pulsed laser beam 2 having the preferred change in terms of time.

In the above-described example, the combination of a Pockels cell 61 and a polarized beam splitter 62 was used as the EO modulator 6, but various types of polarized beam elements can be used. Thus, in the following explanation, the combination of the crystal 61 and polarized beam splitter 62 (or various types of polarized beam elements) will be referred to simply as the "EO modulator 6".

Besides the EO modulator, it is also possible to use an AO (acoustic-optical) modulator. Generally, however, an AO modulator has a lower driving frequency than an EO modulator, and, therefore, it is not applicable to the case where high-speed rising and falling are required, and of extracting a pulsed beam with a small pulse duration. In this way, using a modulator such as the EO modulator 6 or an AO modulator makes it possible to attain a pulsed laser beam having the desired waveform (temporal energy change) with the desired pulse duration from a continuous wave laser beam. In other words, it is possible to perform the desired time modulation.

Figure 6:
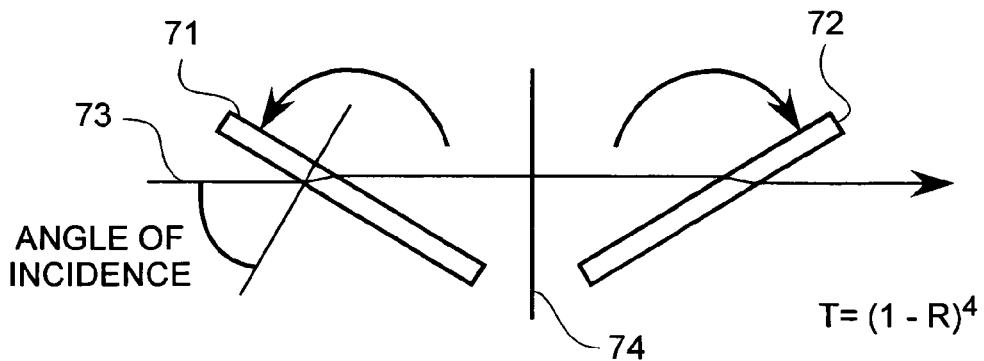
FIG. 6 is a diagram of a continuously variable transmittance filter used in the first embodiment.

The continuously variable transmittance ND filter 7 is provided for the purpose of regulating the output of the laser beam 2 irradiating the sample 26, and it preferably has a continuously variable transmittance. Also, while the filter 7 is placed after the EO modulator 6, as seen in FIG. 1, when the damage threshold is high enough, the filter 7 may also be placed before the EO modulator 6, if the direction of polarization is not rotated or the linearly polarized light is not disrupted when the transmittance is varied. The continuously variable transmittance ND filter 7, having the constitution shown in FIG. 6 is used here. This device has plates which are transparent to the wavelength of the laser beam 2, for example, the quartz plates 71 and 72, that are placed symmetrically relative to a plane 74, which is perpendicular to the optical axis 73. The incident angle is varied, while the symmetrical relationship of the plates is maintained, whereby the quantity of the transmitted laser beam is varied.

Figure 7:
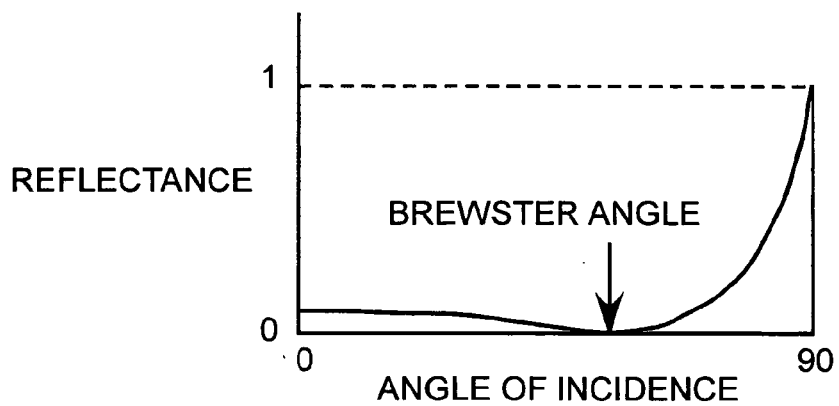
FIG. 7 is a graph showing the relationship between the angle of incidence and reflectance of the P polarized light.

When adjusted so that the linearly polarized laser beam 2 radiates on the quartz plates 71 and 72 as P polarized light, the angles of incidence and reflectance at the interface will change as shown in FIG. 7. The transmittance T can be expressed as T=1−R when the reflectance at the interface is R. The reflectance is 0, and, therefore, the transmittance becomes 1, when the angle of incidence is the Brewster angle, which is the angle attained as $\tan^{-1}$ (N) where the, index of refraction of the quartz plates 71 and 72 is N. As the angle of incidence increases, the reflectance increases and transmittance decreases; so that, when the angle of incidence is 90 degrees, the reflectance becomes 1 and, therefore, the transmittance becomes 0.

Accordingly, the desired reflectance is attained by varying the angle of incidence between the Brewster angle and 90 degrees. In the constitution of the filter as shown in FIG. 6, there are four interfaces between the air, and the quartz. As a result, the overall transmittance T becomes the transmittance at the interface raised to the power of 4, $T4=(1-R)^4$.

Figure 8:
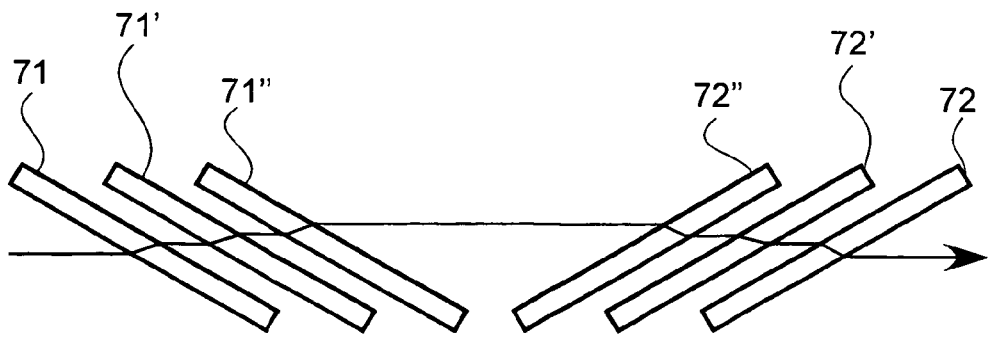
FIG. 8 is a diagram of a continuously variable transmittance filter using a plurality of transparent substrates as employed in the first embodiment.

Because of the size limit, when there is a single plate (quartz plate), a transmittance of a few percent is the limit, realistically, because it is not possible to achieve an angle of incidence of 90 degrees. However, a low transmittance can be easily attained by exponentially varying the number of interfaces between the quartz and the air. As shown in FIG. 8, there are 12 interfaces when the filter has three quartz plates 71, 71', 71'', 72, 72', 72''. As a result, the transmittance T12 is expressed as $T12=(1-R)^{12}$ and the transmittance is effectively decreased without making the angle of incidence very large. Actually, it is not possible to achieve an angle of incidence of 90 degrees, and a transmittance on the order of 0.05 (5%) is easily attained when the quartz plates are made sufficiently large so that the transmittance can be continuously varied between 5 and 100%.

Moreover, there is sometimes influence from reflection from the rear surfaces in the case of using a regular quartz plate, but this can be countered by applying an anti-reflective coating on one surface of the quartz plate. Also, in the case of using a ,plurality of quartz plates, there is sometimes influence from reflection from adjacent quartz plates, but this can be countered by sufficiently increasing the space between the quartz plates.

In addition, in the case where the diameter of the laser beam 2 is small, it is possible to use an ND filter formed of a metal thin film or a dielectric multilayer film, so that the transmittance is continuously varied in the plane of the transparent substrate. Also, where it is not possible to continuously vary the transmittance, the object of the invention can be substantially attained by sequentially switching among ND filters with different transmittances, or with the use of a combination of multiple ND filters having various transmittances. Naturally, it is possible to regulate the laser output by controlling the current of the laser-pumping laser diodes, but this is not preferable, because of such issues as the need to provide a certain amount of time until the output becomes stable, in the case of changing the output.

Figure 9:
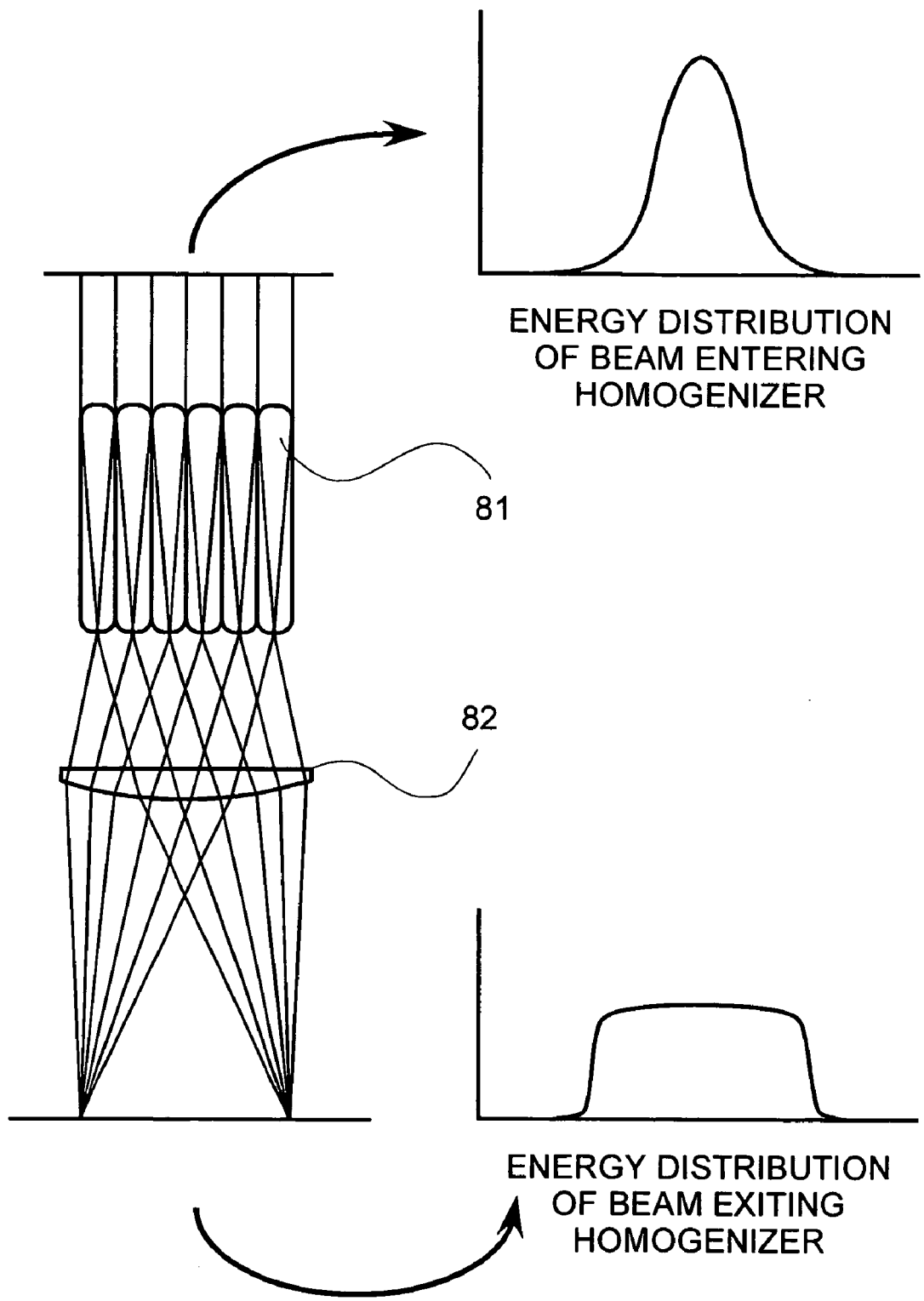
FIG. 9 is a diagrammatic cross sectional view of the front of the beam-homogenizer in the first embodiment, and graphs showing the energy distribution of the incoming and outgoing light.

A gas laser or solid-state laser normally has a Gaussian energy distribution, as shown in FIG. 9, and, therefore, such a laser cannot be used without alteration to the laser annealing relating to the present invention. If the oscillator output is sufficiently large and the beam diameter is sufficiently wide, a uniform energy distribution can be attained by extracting only the comparatively uniform portion in the center. However, in this case, the peripheral portion of the beam is eliminated and a large part of the energy is wasted.

The beam-homogenizer 8 is used in order to resolve this defect and to convert the Gaussian distribution into a uniform distribution. As shown in FIG. 9, one way to do this is to use a combination of a fly eye lens 81, constituted with a two-dimensional array of rod, lenses, and a convex, lens 82. Using this combination, the output beam is converted to a beam having a uniform distribution. Apart from the fly eye lens 81, the same effects can be attained with a combination of two cylindrical lens arrays, arranged such that the axes of the cylindrical lenses intersect:, and a convex lens.

The output beam from the beam-homogenizer 8 is concentrated in only one direction by a cylindrical, lens 9, and, thereby, a linear beam with a uniform energy distribution (but having a Gaussian distribution in the widthwise direction) can be finally attained at the rectangular slit surface. That combination which is constituted of the fly eye lens 81 (or a combination of cylindrical lens arrays), the convex lens 82, and the cylindrical lens 9, so as to form a linear beam with a uniform energy distribution, may also be used as the beam-homogenizer.

Otherwise, a constitution for concentrating the beam in a rectangular or a line form may be established with the use of a plurality of fly eye lenses or a cylindrical lens array. The point is that a laser beam having a Gaussian distribution can be converted to a rectangular or a line beam having a uniform energy density distribution.

Figure 10:
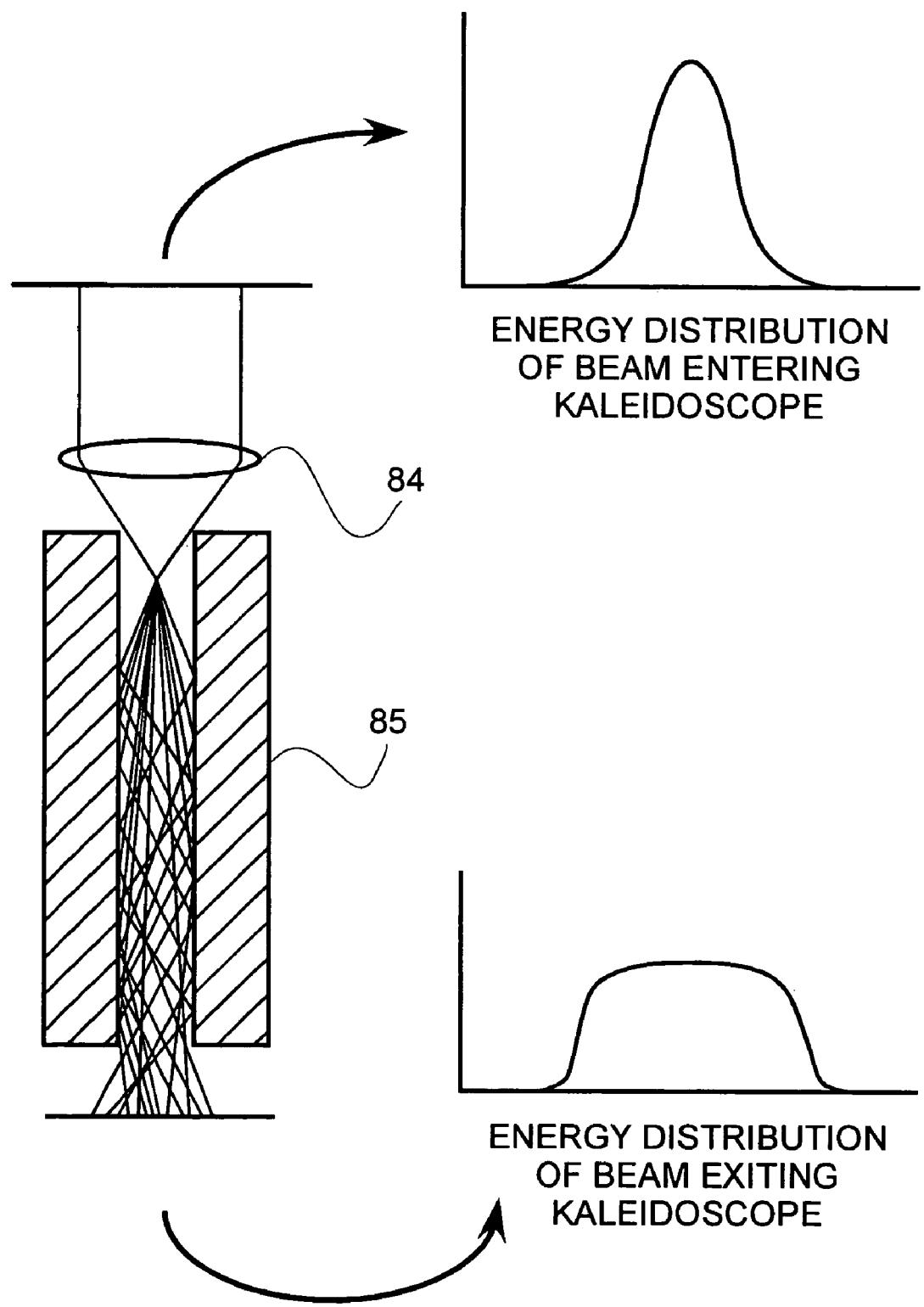
FIG. 10 is a diagrammatic plan view of the front of the kaleidoscope in the first embodiment, and graphs of the energy distribution of incoming and outgoing light.

In addition, as shown in FIG. 10, it is also possible to use a kaleidoscope, wherein the laser beam 2 is concentrated using a lens 84 and then enters a hollow tube 85, whereby the output distribution is made uniform by multiple reflection within the tube 85. In this case, a rectangular or line laser beam 2, having a uniform energy density distribution is attained by the continuous conversion therein, such that the laser beam 2 is round where it enters, but is a rectangular or line-shaped beam where it exits. Otherwise, a prism, may be used wherein the laser beam 2 is split into a plurality of beams which are overlapped with each other.

Figure 11:
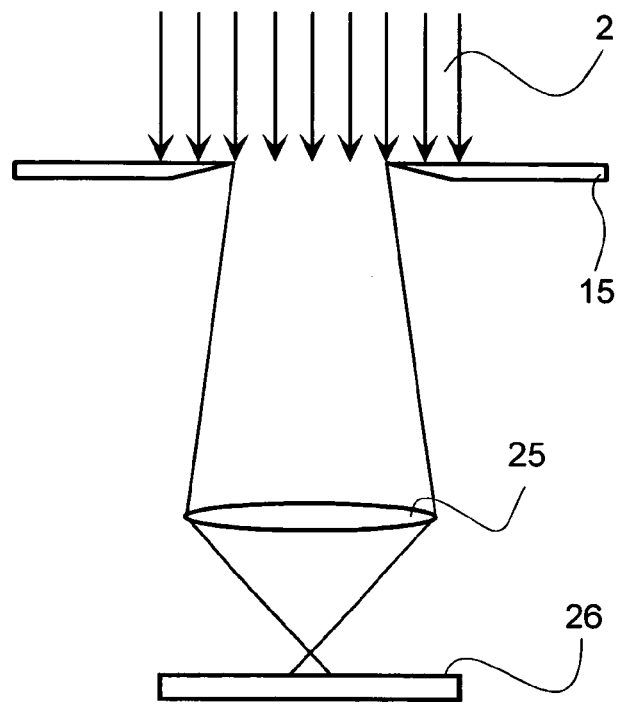
FIG. 11 is a diagram showing the physical relationship between the rectangular slit and objective lens in the first embodiment.

As shown in FIG. 11, the spillover portion is eliminated with use of the electronic rectangular slit 15 from the rectangular or line beam attained as necessary, and the beam is formed in a rectangular or line shape of the required dimensions. There is no problem even if the spillover remains, so that the electromotive rectangular slit 15 may be released to allow the entirety of the laser beam 2 to pass there through. This laser beam 2 is radiated so as to be projected on the surface of the sample 26 by the objective lens 25. When the magnification of the objective lens 25 is M, the size of the image of the electromotive rectangular slit 15, or the laser beam 2 at the surface of the electromotive rectangular slit 15, is the inverse of the magnification, meaning 1/M.

Figure 12:
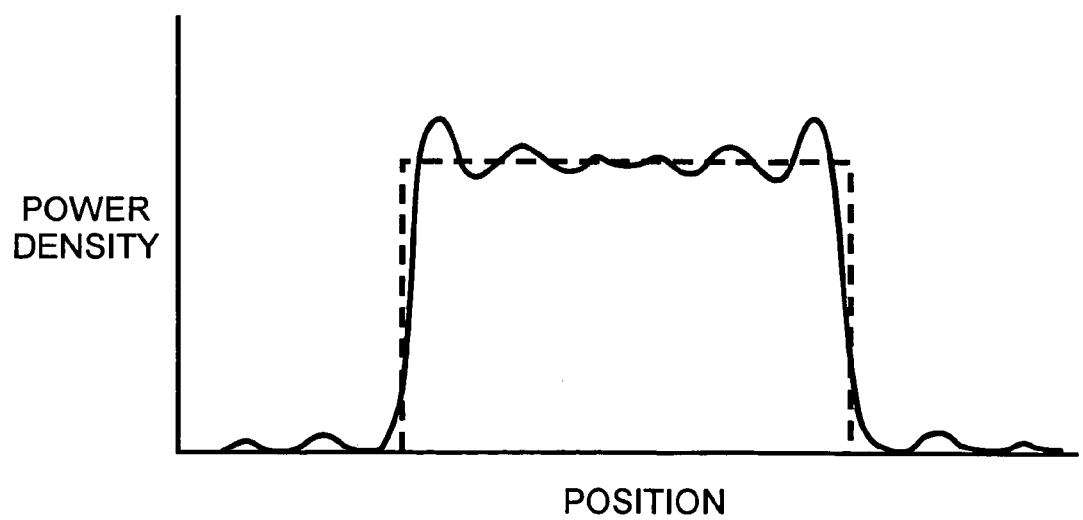
FIG. 12 is a graph showing the energy distribution in the case of projecting a coherent laser beam, in the laser annealing apparatus relating to the first embodiment.

However, even if the laser beam passing through the electromotive rectangular slit 15 has a uniform energy distribution, and even if the laser beam 2 having a coherency, such as provided by a regular $YVO_4$ laser, is formed as a rectangle by the rectangular slit 15 and strikes the surface of the sample 26, an interference pattern determined by the wavelength of the laser beam 2 and the NA of the objective lens 25 occurs under the influence of diffraction at the edge of the rectangular slit 15, and the distribution becomes irregular, as shown in FIG. 12. Furthermore, even when the energy density is partly uniform, a speckle pattern occurs from the influence of the interference.

In order to eliminate these irregularities, a diffuser 13 is inserted in the optical path. This diffuser 13 is formed of a quartz substrate, the surface of which has Irregular variations of 1000 to 2000 mesh. Simply put, the insertion of the diffuser 13 itself has no effect, but when the diffuser 13 is driven to rotate at a high speed by the high-speed rotation driving apparatus 12, the laser beam 2 is diffused in random directions, in terms of time, and the length of the optical path and the direction of travel relative to the surface of the sample 26 are randomly varied.

The laser beam 2 is diffused in various directions during the time in which one pulse of the laser beam 2 is completed. Consequently, because the length of the optical path to the surface of the sample is varied, irregularities in energy density occurring as a result of interference are canceled and the coherency is reduced. As a result, as shown by the broken line in FIG. 12, a projected image having a geometrically uniform energy density distribution is attained.

When the pulse duration of the radiated laser beam 2 is 10 microseconds, and the laser beam is transmitted through a portion 50 mm distant from the center of the diffuser 13, the diffuser 13 moves 300 microns during the period of one pulse, in the case where the diffuser 13 is rotated at a speed of 6000 revolutions per minute. When a 1000 to 2000 mesh plate is used as the diffuser 13, random variations with a period of 8 to 16 microns are formed. Because each portion of the transmitted laser beam passes through 20 or more variations on average, the influence of any interference can be sufficiently canceled, and the coherency of the laser beam is reduced.

Moreover, depending on the object, a more specific energy density distribution than a uniform energy density distribution may be desired; for example, a distribution having a slope in a crosswise direction of the line beam, or a distribution where the energy density is low in the central portion and high in the peripheral portion in the widthwise direction of the linearly formed beam, may be adopted. In those cases, the object can be achieved by inserting a filter 14 having the specific transmittance distribution in the optical path of the electromotive rectangular slit 15.

Likewise, a phase plate (for example, a glass substrate formed with random spots of thick $SiO_2$ film, where the phase varies by 0, p/2 radians, p radians, 3p/2 radians) may be used instead of the diffuser, which phase plate is driven to rotate at high speeds like the diffuser. Otherwise, a vibrating element may be mounted on the mirror 150 or 151, for bending the laser beam by 90 degrees, in the constitution shown in FIG. 1, so that the mirror is caused to vibrate at a high frequency, or more preferably it is caused to vibrate at a frequency synchronized with the timing (corresponding to the pulse duration) in which the laser beam is radiated, whereby the length of the optical path of the laser beam 2 is varied and the effects of interference can be canceled.

To radiate the laser beam 2 on the sample 26, the stage 28 is driven within the XY plane, while the laser beam 2 is radiated in pulses to the desired location. However, when displacement from the focal position occurs because of surface irregularities or a waviness on the sample 26, changes in the energy density and deterioration of the radiated form occur, and the objective of the irradiation cannot be achieved. For this reason, to make possible a continual irradiation of the focal position, control is performed to detect the focal position using an auto focusing optical system 24, and, in the event of displacement from the focal position, to drive the stage 28 in the Z direction (height) so as to be continually at the focal position.

The surface of the sample 26 that is irradiated with the laser beam 2 can be imaged by the CCD camera 19 using the incident light from the illuminating light source 18, and the image is observed using the monitor 22. In the case of observation during laser radiation, a laser cut filter 20 is inserted ahead of the CCD camera 19, and it serves to prevent halation of the CCD camera 19 with the laser light reflected by the surface of the sample 26, thereby to prevent damage to the camera.

A power meter 29 for measuring the output power of the laser beam 2 irradiating the sample 26 and a beam profiler 30 for measuring the energy density distribution are disposed on the stage 28. As necessary, the laser output and energy distribution (profile) can be measured by moving the stage 28 and positioning the light collecting portions of the abovementioned power meter 29 or beam profiler 30 at the optical axis in a state where they are directly below the objective lens 25 or spaced from the objective lens 25.

Because of the low damage threshold for the light collecting portions, attenuation is necessary for the measurement of the beam profile, so that the energy density distribution does not change. For this reason, an attenuation filter (not shown) may be inserted in the optical path. When a plurality of attenuation filters are inserted, reflected light is reflected again between the filters, overlaps the transmitted light, and disrupts the profile in many cases. As a result, the filters are not inserted perpendicular to the optical axis, but may be inclined with respect to a plane perpendicular to the optical axis, with a large space being provided between the filters.

For the alignment of the sample 26, an alignment mark or specific pattern on the sample 26 is formed in several locations and viewed with the objective lens 25 and CCD camera 19, and processing of each image is performed by image processing units (not shown). The positions of the center of gravity of the alignment marks are detected in this way and alignment can be performed with respect to the XYZ axes by moving the stage 28.

In FIG. 1, a single objective lens 25 is shown, but a plurality of objective lenses may be installed on an electromotive revolver, and the optimal objective lens for a process can be used by switching lenses according to a signal from the control apparatus 31. Specifically, an objective lens appropriate for each of the following processes can be used: rough alignment when loading the sample 26, fine alignment when necessary, the laser annealing process, observation after processing, and the formation of alignment marks, as will be discussed below. Naturally, it is also possible to establish a separate optical system (lens, imaging apparatus, and lighting apparatus) for alignment, but the alignment precision can be improved with detection on the same optical axis by having the optical system for laser annealing double as the alignment optical system.

Figure 13A:
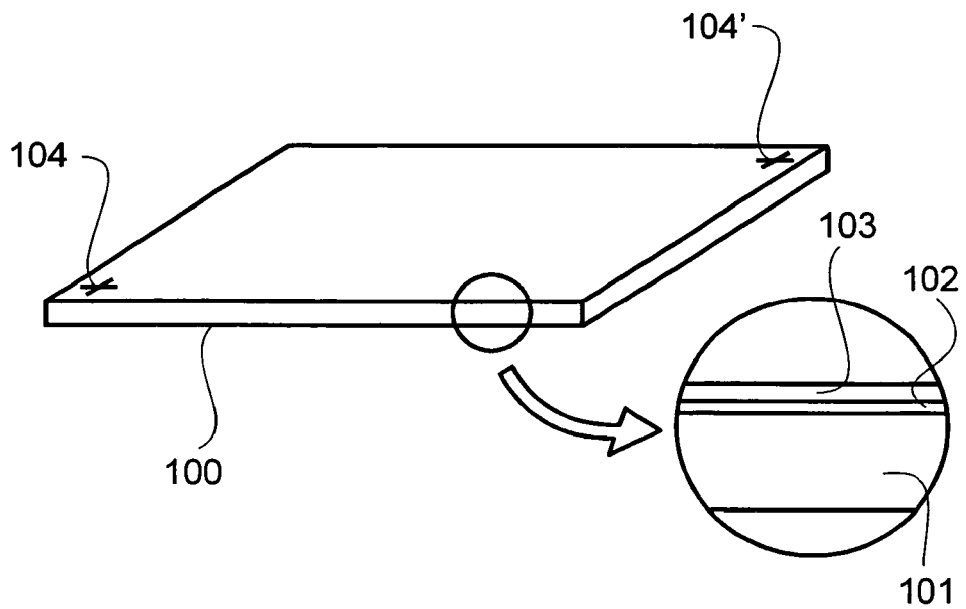
FIGS. 13A, 13B and 13C are diagrams of a substrate, illustrating the procedures used in the laser annealing method relating to the first embodiment.

The laser annealing method, which is one embodiment of the present invention and which is performed using the abovementioned laser annealing apparatus relating to the present invention, will be explained next using FIGS. 13A to 13C. As shown in FIG. 13A, a polycrystalline silicon thin film substrate 100 with the following constitution is used as the sample 26. An amorphous silicon thin film is formed on the principle plane of the glass substrate 101 with an insulating thin film 102 disposed therebetween, and this film is crystallized into a polycrystalline silicon thin film 103 by the scanning of the entire surface thereof with an excimer laser beam 105. The insulating thin film 102 is $SiO_2$, SiN, or a composite film thereof. The polycrystalline silicon thin film substrate 100 is placed on the stage 28.

As shown in FIG. 13A, alignment marks 104, 104' are formed in two locations on this polycrystalline silicon thin film substrate 100. These alignment marks 104, 104' are usually formed with a photo-etching technique, but It is very wasteful to perform a photo-resist process just for this purpose. For this reason, cross-shaped marks can be formed as the alignment marks 104, 104' by successively irradiating the substrate with the laser beam 2 used for laser annealing into horizontal and vertical rectangles, for example, by use of the electromotive rectangular slit 15, and removing the polycrystalline silicon thin film therewith. In this case, the energy density is naturally set higher than in the case of performing annealing.

Figure 13B:
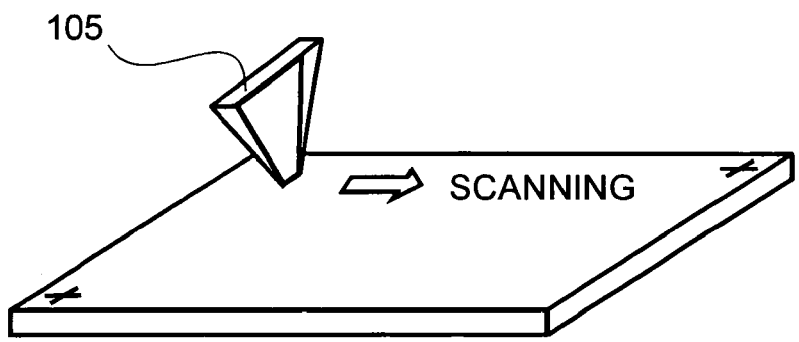

While the stage 28 or optical system is caused to move as shown in FIG. 13B, according to the design coordinates based on the alignment marks 104, 104', the objective lens 25 concentrates a laser beam 105 for annealing, having a given pulse waveform, through the EO modulator 6, and the beam is given the desired energy distribution by the homogenizer 8 and filter 14, and loses its coherency by passing through the diffuser 13, which is rotating at a high speed.

The irradiated region is the portion where a driver circuit is formed for driving each pixel, for example. While the polycrystalline silicon thin film substrate 100 Is moved relatively as necessary and is passed back and forth a plurality of times, the necessary portions only are successively irradiated. According to the constitution of the apparatus, relative scanning may also be performed by moving the optical system.

Figure 21A:
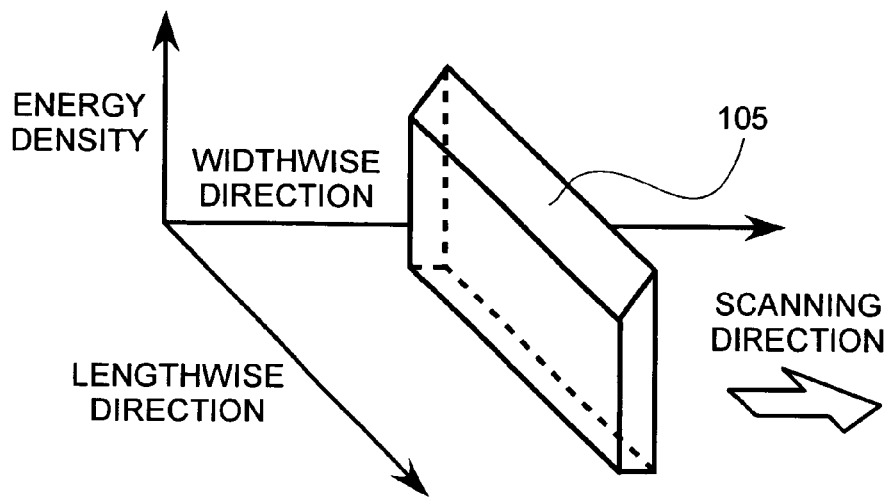
FIGS. 21A through 21D are diagrams showing the energy distribution and change in terms of time of the energy of the laser beam irradiated in the laser annealing method.
Figure 21B:
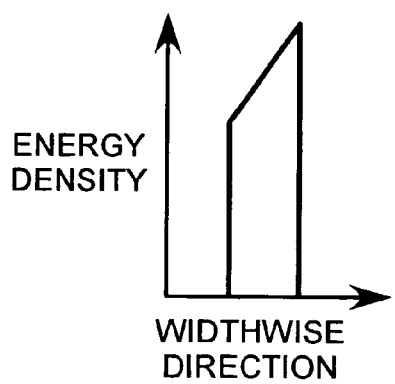
Figure 21C:
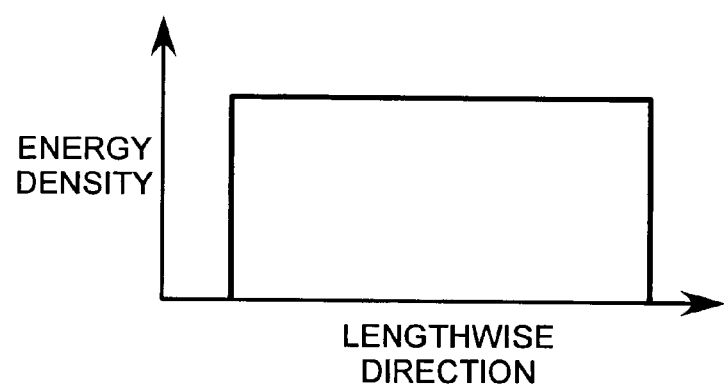

More specifically, the laser beam 105, having the energy density distribution as shown in FIG. 21A, is irradiated. The crosswise energy density distribution is sloped, as shown in FIG. 21B, and the, energy density becomes high in the scanning direction. Also, the lengthwise energy density distribution corresponds to the uniform energy density distribution, as shown in FIG. 21C. Also, the pulse waveform becomes the waveform as shown in FIG. 21D, which provides a uniform energy for an initial uniform, period of time and thereafter decreases linearly.

The size of the irradiated region is established ma 500 micrometer by 20 micrometer rectangle, f or example. This size is determined by the output of the laser oscillator 3; although, a larger region can be irradiated if oscillation at a sufficiently high output is possible. The crosswise energy density shown in FIG. 21B is set so as to vary linearly by 20% in size from the forward energy density to the opposite side in the scanning direction.

Figure 21D:
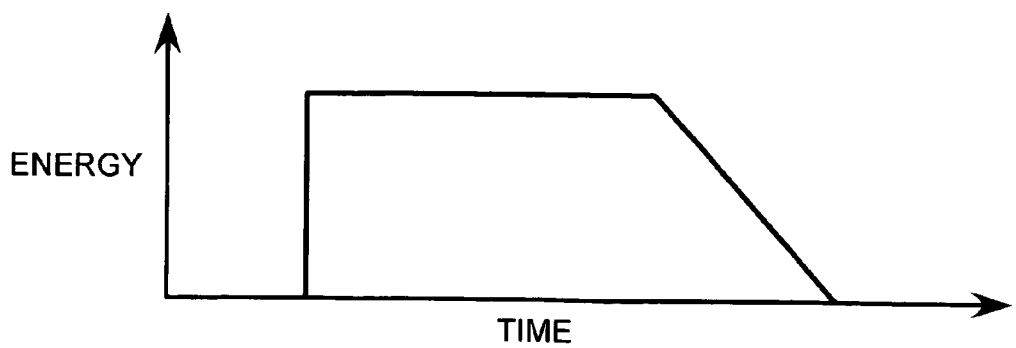

Also, as shown in FIG. 21D, the irradiation time (pulse duration) of the laser beam 105 is set so as to have a constant energy for the first 10 microseconds and to then decrease linearly for the next five microseconds. While the polycrystalline silicon thin film substrate 100 is moved relatively at a speed of 100 mm per second, the laser beam is radiated at a 25 micrometer pitch. Thereby, a laser irradiated region of 500 micrometers by 20 micrometers is formed at a 25 micrometer pitch. In view of the distance moved during the abovementioned 15 microsecond laser radiation time, this is a 500 micrometer by 21.5 micrometer laser irradiation region in a stricter sense.

To radiate the laser beam 105 at a precise 25 micrometer pitch, the distance traveled by the stage 28 or polycrystalline silicon thin film substrate 100 may be detected and the EO modulator caused to operate at a 25 micrometer movement. More specifically, a distance measuring apparatus, such as a linear encoder or linear scale (not shown), may be provided on the stage 28, whereon there is disposed the polycrystalline silicon thin film substrate 100, or a rotary encoder may be provided on the drive shaft of the stage 28. The encoder output pulses corresponding to the 25 micrometer movement may be counted, and a trigger signal to drive the EO modulator emitted.

In this system, radiation at a precise 25 micrometer pitch is possible even if the speed of the stage 28 varies somewhat. Naturally, while the laser beam 105 is being radiated, the stage 28 preferably moves at a constant speed. In the case of moving at a constant speed, the EO modulator may also be driven at a constant time interval (in the abovementioned case, a 250 microsecond interval). However, in view of speed variations and irregularities of the stage 28, it is clearly more desirable to have a system for detecting the distance traveled.

Figure 15:
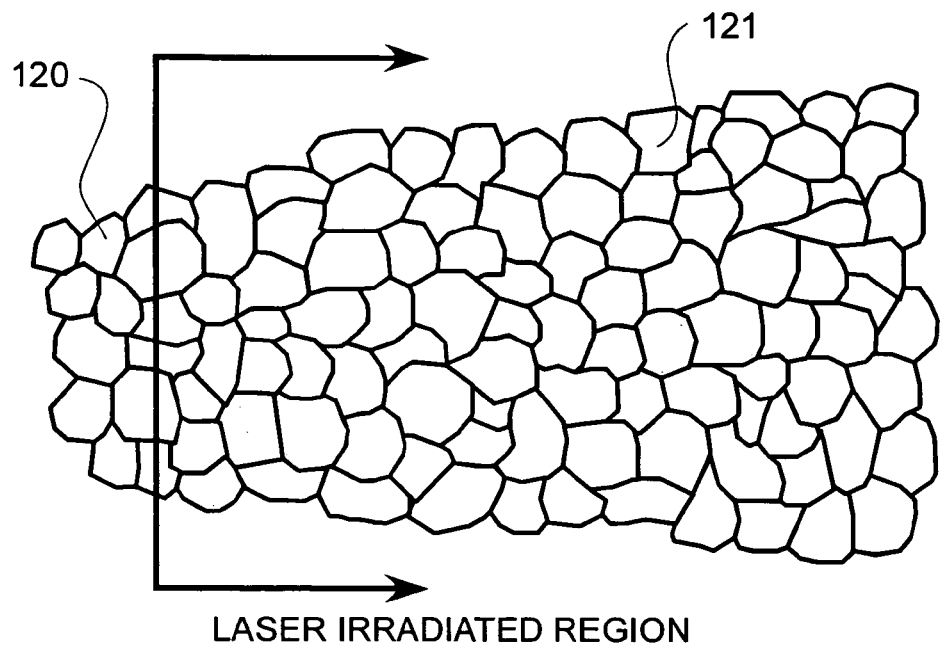
FIG. 15 is a diagrammatic view showing the state of the crystal before, performing the annealing method relating to the first embodiment.

As shown in FIG. 15, a polycrystalline silicon thin film 103 is used in the present embodiment as the substrate that is annealed with the excimer laser. The polycrystalline silicon thin film 103 attained by annealing with the excimer laser is an aggregate of small crystal, grains 120, 121 with crystal grain sizes of no more than one micron (several hundred nanometers). When the region shown in the drawing is irradiated with a laser beam, the fine crystal grains 120 outside the laser irradiation region remain in their present state, but the fine crystal grains (for example, crystal grain 121) within the laser irradiation region are melted.

Figure 16:
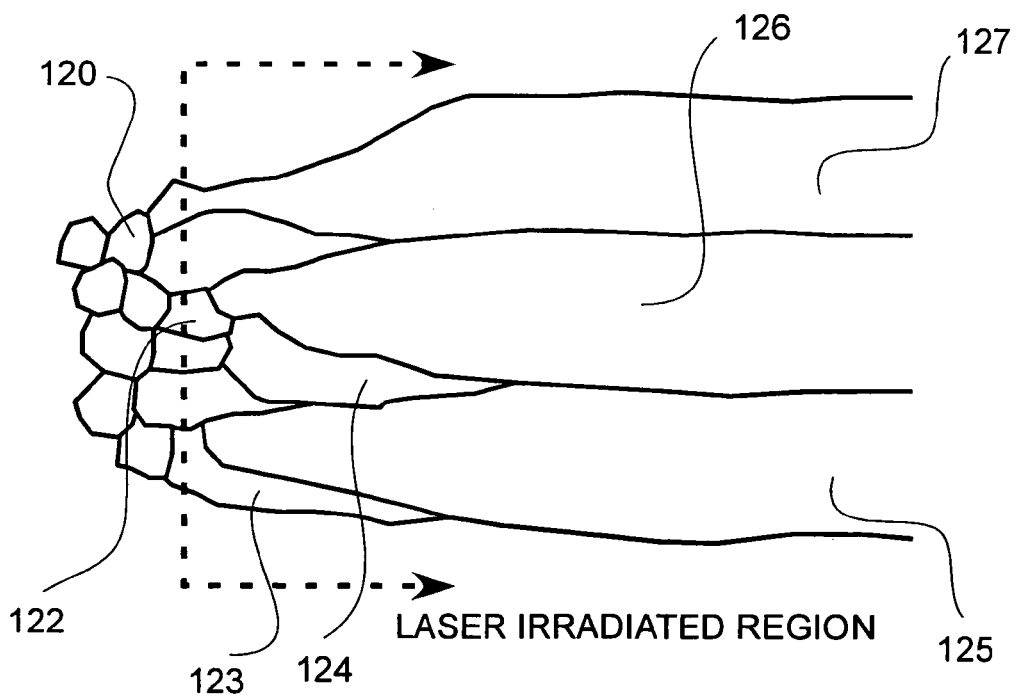
FIG. 16 is a diagrammatic view showing the state of the crystal after performing the annealing method relating to the first embodiment.

Thereafter, with the laser energy being reduced or radiation being stopped, the melted silicon forms crystals growing from the low temperature side toward the high temperature side and having the same crystal orientation as the seed crystals along the temperature gradient, where the seed crystals are crystal grains which remain at the edges of the molten region. The growth speed of the crystal grains at this time varies depending on the crystal orientation, and, therefore, only those crystal grains having a crystal orientation with a faster growth speed ultimately remain. Specifically, as shown in FIG. 16, the crystal grain 122, having a crystal orientation with a slow growth speed, is suppressed by the growth of surrounding crystal grains having a crystal orientation with a faster growth speed, and the crystal growth is stopped.

Also, crystal grains 123 and 124, having a crystal orientation with a moderate growth speed continue to grow, but are suppressed by the growth of crystal grains with a higher growth speed, and, before long, their growth stops. Finally, only crystal grains 125, 126 and 127, having a crystal orientation with the fastest growth speed continue to grow. These crystal grains 125, 126 and 127, which continue to grow to the end, are individual crystal grains in a strict sense, but have mostly the same crystal orientation. The melted and re-crystallized portion can effectively be viewed as a single crystal.

Figure 13C:
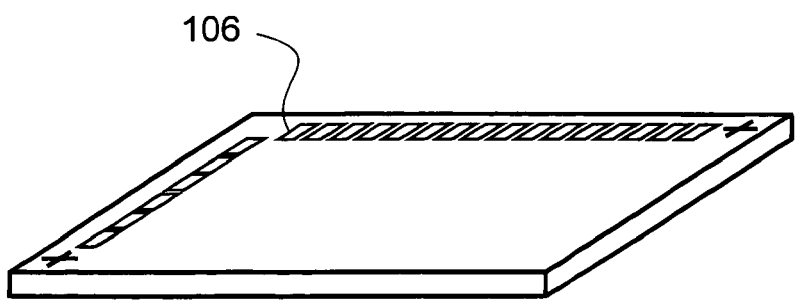

By radiating the laser beam on the polycrystalline silicon thin film 103, as discussed above, only the part of the polycrystalline silicon thin film 103 that is irradiated with the laser beam 105 is annealed like an island, as shown in FIG. 13C; that is, only the crystal grains having a specific crystal orientation are formed and are in a polycrystalline state in a strict sense. However, regions 106 having ,a nearly single crystal character are formed. In particular, this may substantially be considered as a single crystal in the direction which does not cross the crystal grain boundaries.

By repeating these procedures and radiating the laser 105 successively on portions requiring annealing during relative scanning of the polycrystalline silicon thin film substrate 100, regions to form a transistor of a driver circuit are all converted to regions 106 having a nearly single crystal character. Furthermore, because the crystal grains grow in a uniform direction in the regions 106, having a nearly single crystal character, as shown in FIG. 16, the flow of current across the crystal grain boundaries can be avoided by matching the direction in which current flows with the direction of crystal grain growth when the transistor is formed.

The direction in which the crystal grains grow can be controlled by the energy density distribution of the irradiated laser beam 105 and the scanning direction of the laser beam (actually, the scanning direction of the stage). Specifically, as shown in FIG. 21B, when a slope is provided to the energy density distribution, the crystal grains began re-crystallizing from the place where the energy density is low (low temperature side) and grow towards the place where the energy density is high (high temperature side).

Also, with the scanning of the laser beam 105, the temperature drops from the portion outside the irradiated region, re-crystallization begins, and crystals grow in the scanning direction of the laser beam. With the present, embodiment crystal grains, are attained which grow greater than the 1 micrometer crystal grain sizes obtained from annealing with an excimer laser in the crosswise direction, and which grow to 10 micrometers or greater in the lengthwise direction.

Figure 19:
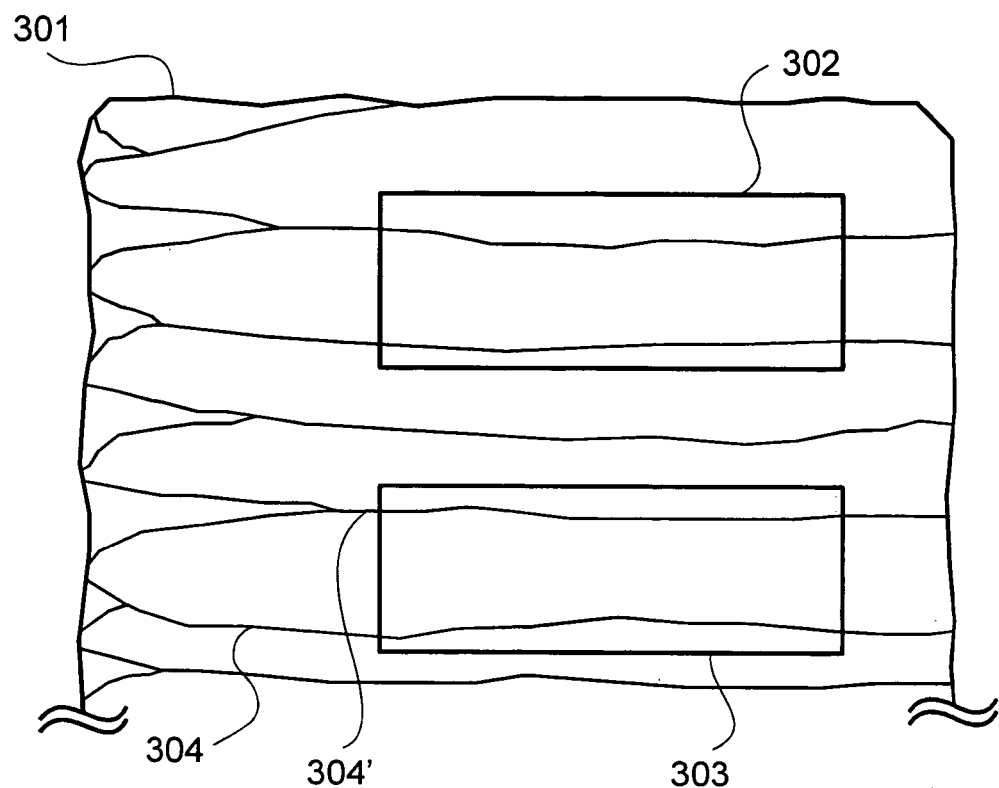
FIG. 19 is a diagrammatic plan view of a substrate showing the physical relationship between the region where the laser annealing method was performed and the active region of the driving circuit.
Figure 20:
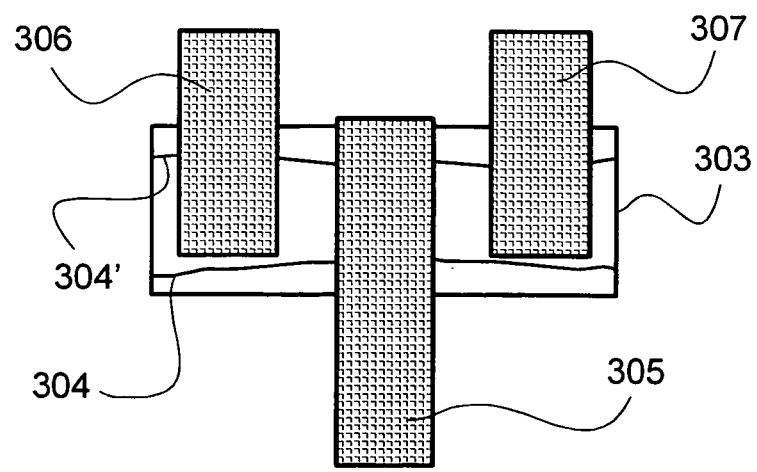
FIG. 20 is a diagram of a substrate showing the constitution of a transistor for a driving circuit formed by the laser annealing method.

Also, in the laser irradiated region 301, as shown in FIG. 19, portions constituted only of crystal grains with a high growth speed may be positioned to become the active layers (active regions) 302, 303 of a driving transistor. Through diffusing with an impurities-implantation process and a photo-etching process, portions outside of the active regions 302, 303 are removed. With a photo-etching process, as shown in FIG. 20, a gate electrode 305 over a gate insulating film, a source electrode 306 and a drain electrode 306-307 having ohmic connections are formed, and the transistor is completed. Crystal grain boundaries 304, 304' are present in the active region 303. However, because current flows between the source electrode 306 and drain electrode 307, current does not cross the crystal grain boundaries 304, 304', and a mobility substantially equivalent to the case of a single crystal is attained.

As mentioned above, by matching the direction of the flow of current with the direction that does not cross crystal boundaries for portions which were melted and re-crystallized with laser annealing according to the present invention, the mobility can be improved to double or more than that of a polycrystalline silicon thin film 103 which only underwent annealing with an excimer laser This mobility is a value sufficient for the formation of a liquid crystal driver circuit which can drive at a high speed.

On the other hand, pixel switching transistors are formed in the region of the polycrystalline silicon thin film 103, which only underwent annealing with an excimer laser. Because the crystal grains are fine and are randomly oriented in the polycrystalline film attained by annealing with the excimer laser, the mobility is low compared to that of the crystal grains attained by laser annealing with the present invention, but such annealing is sufficient for use in pixel switching transistors.

In some cases, even an amorphous silicon film is sufficient for use as a pixel switching transistor. In that case, annealing with an excimer laser is limited to only portions for forming the driving circuit, and the laser annealing method according to the present invention may be performed thereafter.

Figure 24:
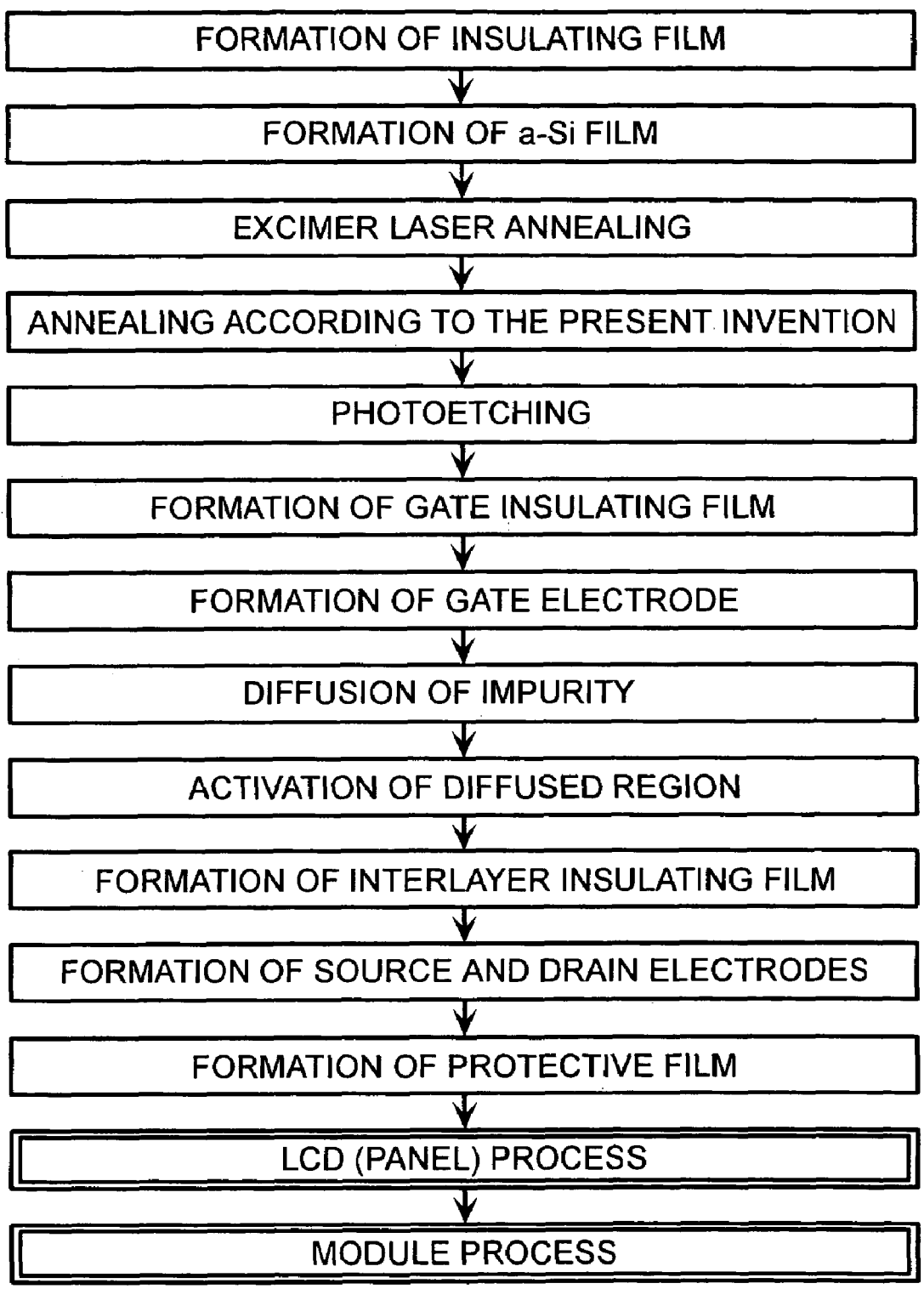
FIG. 24 is a flow chart showing the process for manufacturing a liquid crystal display apparatus wherein the laser annealing method is applied.
Figure 25:
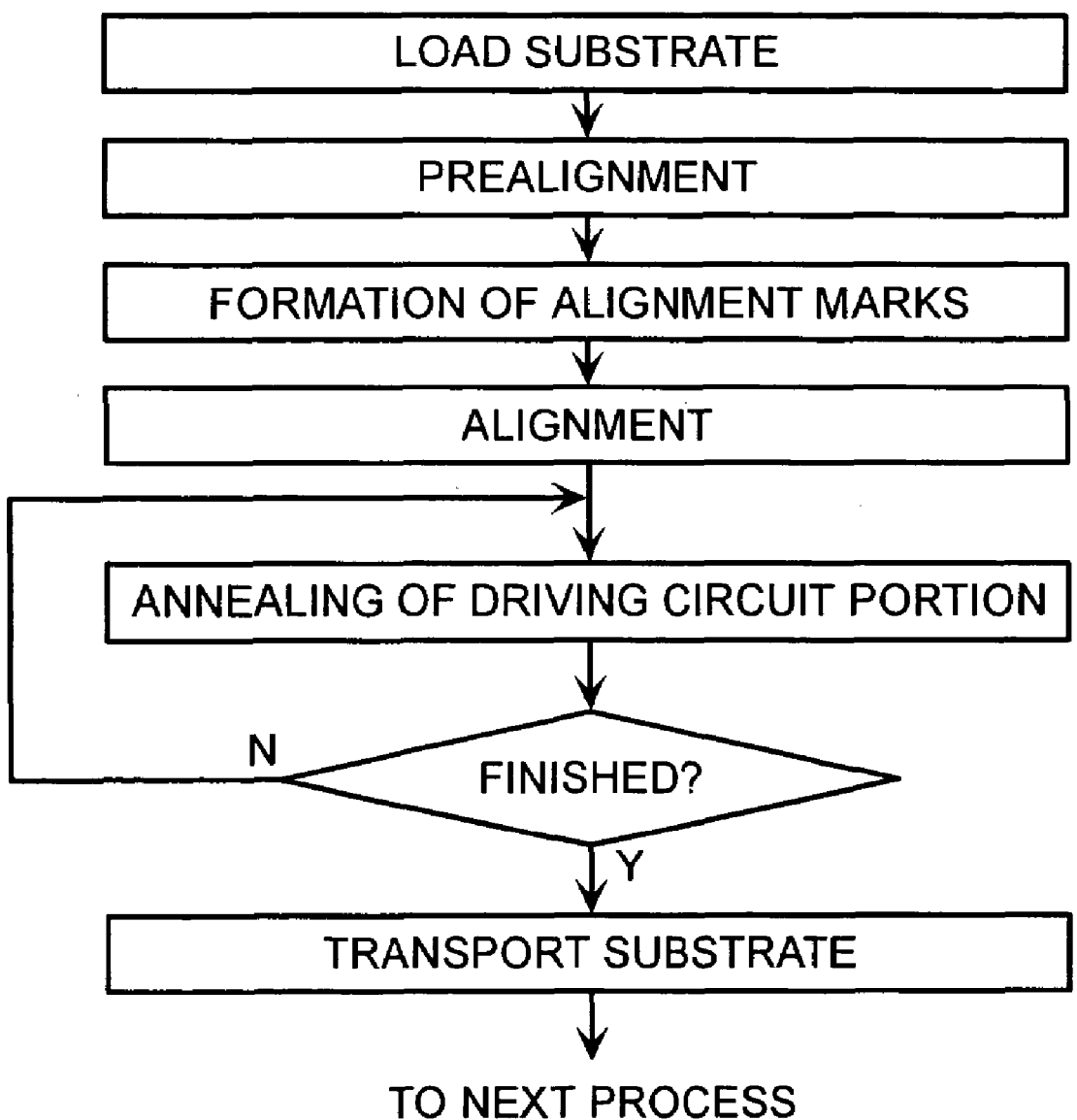
FIG. 25 is a flow chart showing the laser annealing process.

The procedures discussed above can be seen in the flow charts provided in FIGS. 24 and 25. Specifically, insulating film formation and a-Si film formation are performed on the substrate; and, after excimer laser annealing, laser, annealing according to the present invention is performed for only those portions for forming the driving circuit.

To explain laser annealing according to the present invention in more detail, a substrate which Underwent excimer laser annealing using the procedures shown in FIG. 25 is loaded in the laser annealing apparatus relating to the present invention. Pre-alignment is then performed at the substrate edge or corner, and an alignment mark is formed by laser processing. After the alignment mark is detected and alignment (fine alignment) is performed, laser annealing is performed for only those portions forming the driving circuit according to the design data. In the case where the alignment mark is formed using a photo-resist process at the point in time when the substrate is loaded in the laser annealing apparatus, the pre-alignment and alignment mark forming processes are not necessary. The substrate is transported with repetition until the desired region is entirely annealed.

Afterwards, as shown in the flow chart in FIG. 24, islands of polycrystalline silicon film are caused to remain at only portions where necessary, based on the alignment marks 104, 104' or on the origin coordinate, calculated from the alignment marks 104, 104', through a photo-etching process. Thereafter, gate insulating film formation and gate electrode formation are performed with a photo-resist process, and then implantation of impurities and the activation of the implanted impurities are performed.

Figure 14A:
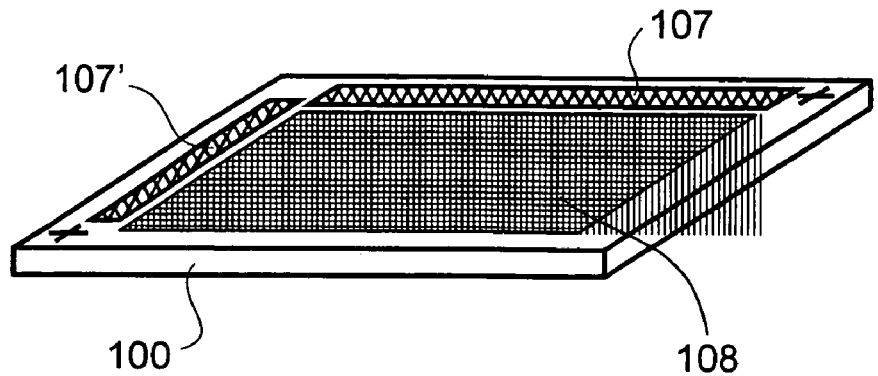
FIGS. 14A, 14B and 14C are diagrams illustrating the processing of the TFT display apparatus following annealing.

Afterwards, through photo-resist processes, such, as interlayer insulating film formation, source and drain electrode formation, and protective film (passivation film) formation, the driving circuits 107, 107' and pixels 108 are formed on the polycrystalline silicon thin film substrate 100, as shown in FIG. 14A, and a TFT device is completed. Moreover, after the laser annealing according to the present invention is performed, the alignment marks 104, 104' are used for positioning in at least one photo-resist process. Thereafter, newly formed alignment marks may be used in the above-mentioned photo-resist processes.

Figure 14B:
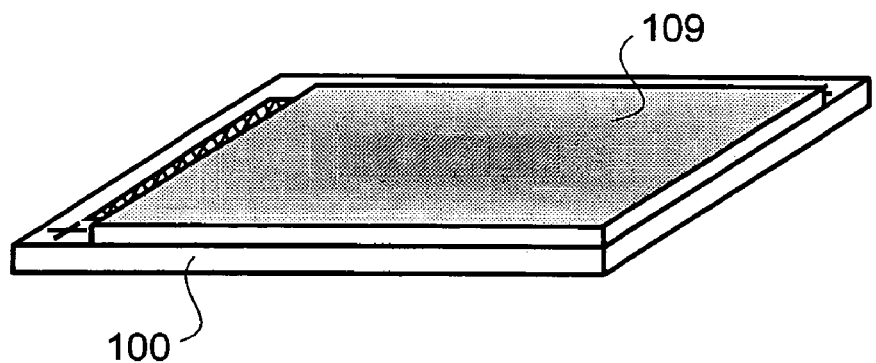
Figure 14C:
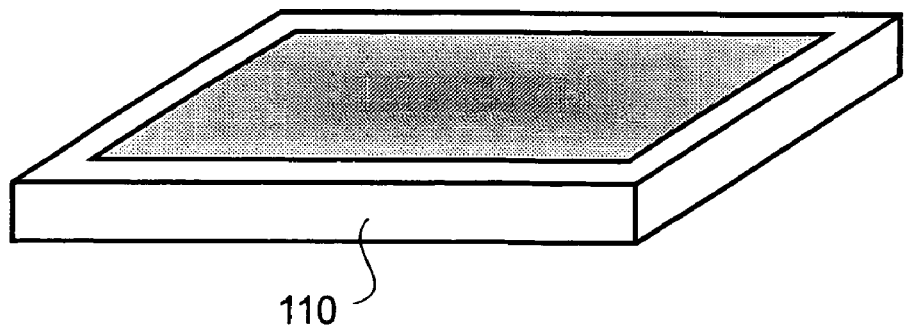

Afterwards, through an LCD process (panel process) for laying a color filter 109 on the TFT device, through processes such as orientation film formation and rubbing, and sealing liquid crystal material therein, as shown in FIG. 14B, and through a module process for placement of the substrate in a chassis 110 together with a back light (not shown) or the like, as shown in FIG. 14C, a liquid crystal display device having a high-speed driver circuit is completed.

Figure 26A:
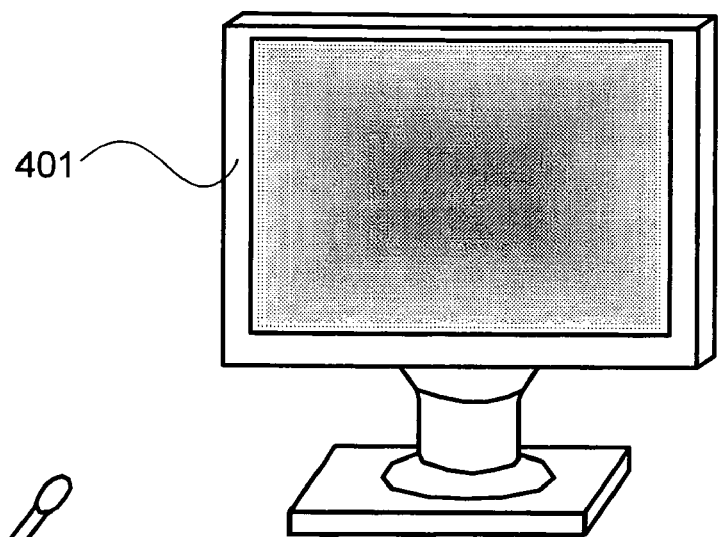
FIGS. 26A, 26B and 26C are perspective views showing respective examples of the application of a liquid crystal display apparatus, constituted with the TFT device, wherein laser annealing is applied.
Figure 26B:
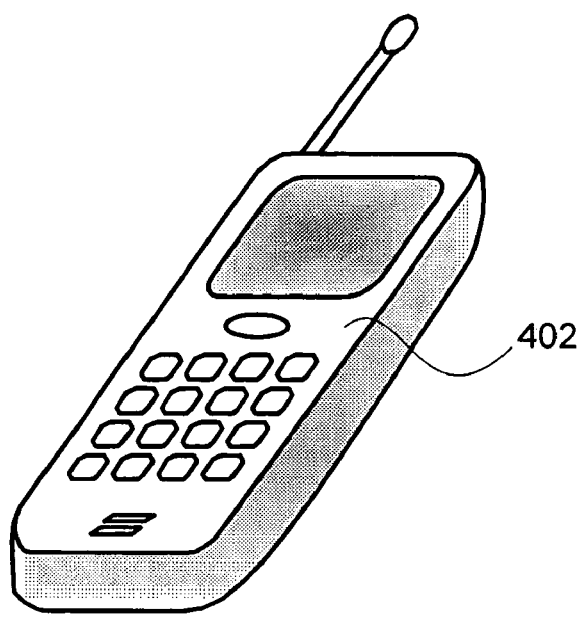
Figure 26C:
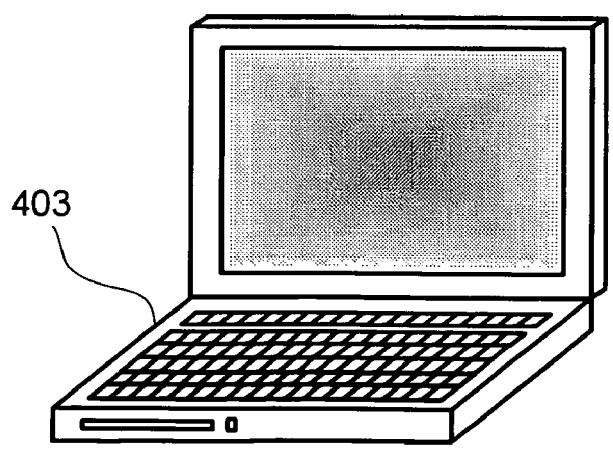

Examples of products including the liquid crystal display apparatus manufactured with the application of laser annealing according to the present invention include the following: the display portion of a liquid crystal television 401, as shown in FIG. 26A, the display portion of the portable telephone 402, as shown in FIG. 26B, or the display portion of the notebook computer 403, as shown in FIG. 26C, in addition to the display portion of various types of instruments mounted in an automobile dashboard, as well as the display, portion of a portable game device.

Figure 17:
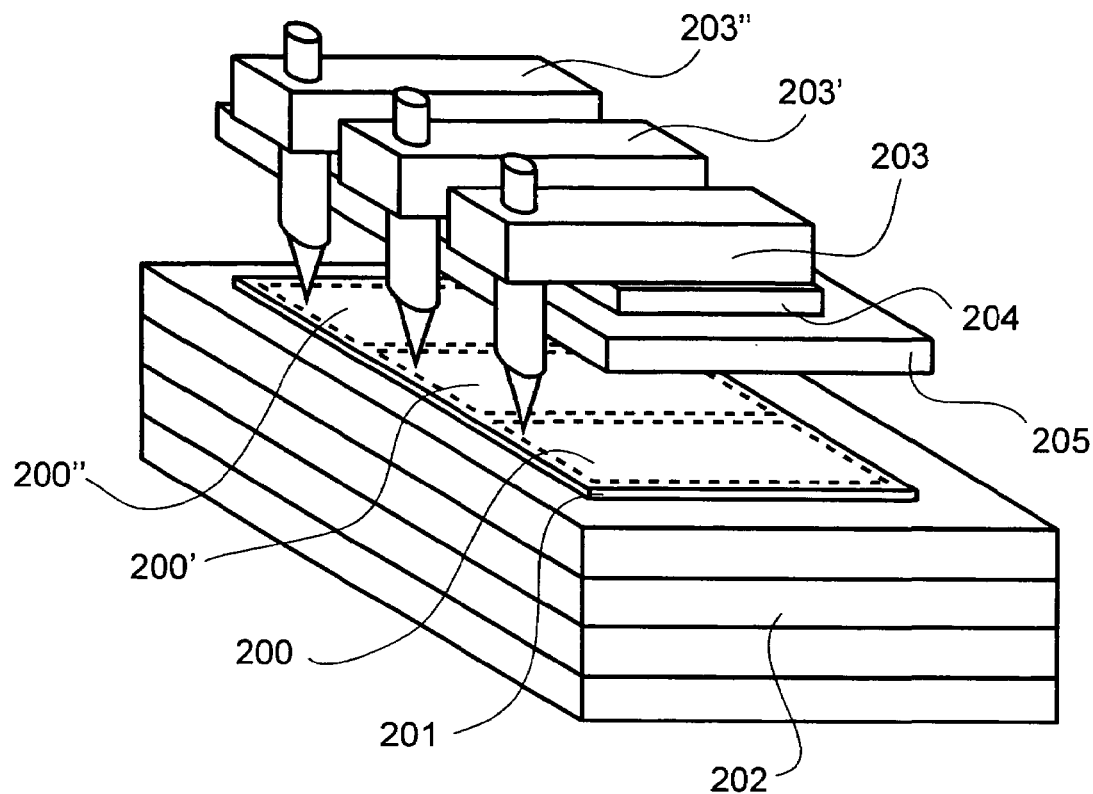
FIG. 17 is a diagrammatic perspective view showing the constitution of the laser annealing apparatus relating to a second embodiment.

Next, another embodiment of the laser annealing apparatus relating to the present invention will be explained with reference to FIG. 17. The present embodiment comprises a stage 202 on which there is loaded a large substrate 201, from which a plurality of panels 200, 200', 200" can be acquired; a plurality of optical lens barrels 203, 203', 203" provided to the laser radiating optical system, an adjustment stage 204 (the adjustment stages for optical lens barrels 203', 203" are not shown) for independently adjusting the position of each of the abovementioned optical lens barrels; and a rack 205 (partially shown, in this drawing) for holding the abovementioned adjustment stages 204.

Figure 18:
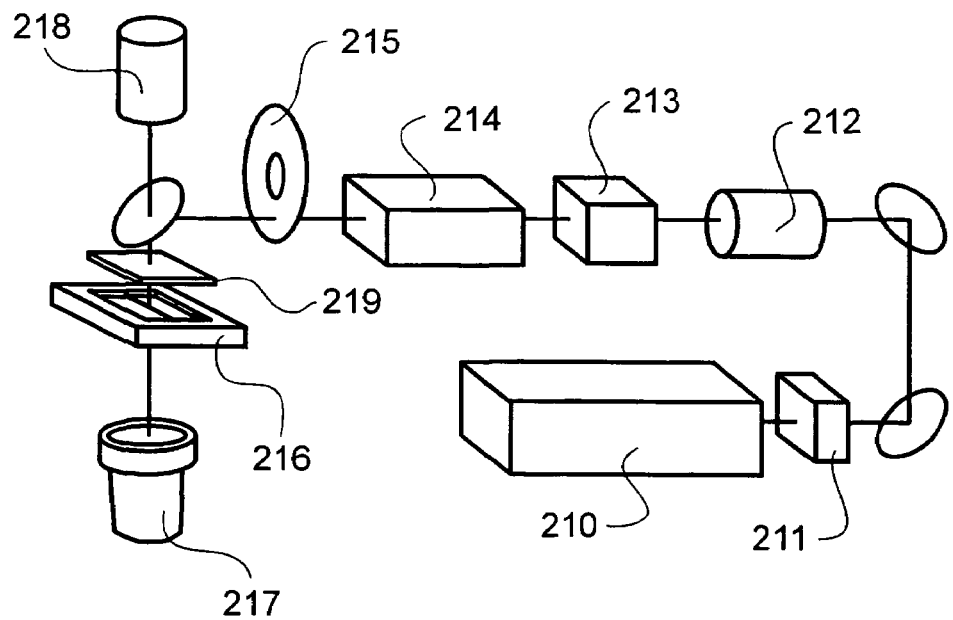
FIG. 18 is a diagram view showing the constitution of the laser radiating optical system in the laser annealing apparatus relating to a third embodiment.

As shown in FIG. 18, a laser radiating optical system contained within the optical lens barrels 203 includes a laser oscillator 210, a shutter 211, a beam expander 212, an EO modulator 213, a beam-homogenizer 214, a high-speed rotating diffuser 215, a rectangular slit 216, an objective lens 217, a CCD camera 218, and a filter 219 for attaining the desired energy density distribution. Moreover, the basic constitution is that shown in FIG. 1, although the following elements are omitted from FIG. 18: an illuminating apparatus for observation, a light source apparatus for the reference beam, an observation monitor, a high-speed rotating mechanism for the diffuser, an auto-focusing optical system, an image processing unit, a control apparatus, and so forth.

The functions of each portion are the same as for the laser annealing apparatus shown in FIG. 1, and so they are not discussed in detail here. Different aspects are as follows. A plurality of groups (three groups in FIG. 17) of the laser radiating optical systems are each contained within individual: optical lens barrels 203, 203', 203"; each of those is fixed on the adjustment stage 204, which can be moved independently in the XYZ directions; position adjustment is possible, so that each optical lens barrel 203, 203', 203" can radiate a laser beam at the same position on each panel, whereby laser annealing can be performed for a plurality of locations at the same time.

The laser annealing method, using the abovementioned laser annealing apparatus, will be explained next. As shown in FIG. 13A, the substrate 201 being used is a substrate having the same constitution as the polycrystalline silicon thin film substrate 100, wherein an amorphous silicon thin film is formed on the principle surface of the glass substrate 101, with an insulating thin film 102 interposed therebetween, and the amorphous silicon thin film 103 is re-crystallized by scanning with an excimer laser over the entire surface. The insulating thin film 102 is $SiO_2$, SiN, or a composite thereof. A plurality of panels may be formed on the polycrystalline silicon thin film substrate 201 (three panels are formed on one substrate in the example shown in FIG. 17).

The substrate 2,01 is loaded on the stage 202. Alignment marks (not shown) are formed in a plurality of locations in the regions where each panel 200, 200', 200" will be formed on this polycrystalline silicon thin film substrate 201. These alignment marks are, normally formed with a photo-etching technique, however, it is wasteful to perform a photo-resist process just for this purpose. For this reason, after detecting the corners of the polycrystalline silicon thin film substrate 201 and performing a rough alignment, cross-shaped marks are formed as alignment marks at a plurality of locations, on each panel 200, 200', 200" successively by forming the laser beam that is used for laser annealing from one optical lens barrel (for example, 203) using the rectangular slit 216, into vertical and horizontal rectangles, for example, and removing the polycrystalline silicon thin film. Otherwise, after positioning each of the optical lens barrels 203, 203', 203" to predetermined standard positions, cross shaped marks are formed as alignment marks at a plurality of locations.

Next, alignment marks in two locations are successively imaged with the CCD camera 218 on one optical lens barrel (for example, 203), the center of gravity position thereof is detected, and fine alignment of the substrate 201 is performed by moving the stage 202 along the XYZ axes according to the design coordinates, based on the alignment marks. Moreover, while the CCD camera of the optical lens barrel for performing annealing may be used for detecting the alignment marks, a separate alignment optical system may be additionally installed. In this case, a plurality of alignment marks may be detected successively with a single optical system, or a plurality of alignment marks may be detected at the same time with a plurality of optical systems.

Afterwards, the stage 202 is moved so that the location of each of the alignment marks for each panel 200, 200', 200" enters the field of view of each optical lens barrel according to the design coordinates. The alignment marks are imaged by the CCD camera 218 of each optical lens barrel 203, 203', 203", and the positions are adjusted with the adjustment stage 204 of each optical lens barrel 203, 203', 203" so that the center of gravity matches the center of the viewing field. The position of each of ,the optical lens barrels 203, 203', 203" is thereby adjusted so as to irradiate the same location on the panels 200, 200', 200" formed on the substrate 201.

Thereafter, the laser beam irradiates and anneals only those portions where the active layer (active region) of the driving circuit is to be formed on each panel 200, 200', 200" according to the design data as discussed above.

As discussed above, the laser beam being radiated has a given pulse waveform, due to the EO modulator 213, and a desired energy density distribution due to the homogenizer 214 and transmittive filter, as necessary. This laser beam is diffused by passing through the high-speed rotating diffuser 215, loses coherency, is formed in the shape of a rectangle by the rectangular slit 216, and is concentrated and radiated by the objective lens 217. As necessary, the beam output from the homogenizer 214 is constituted so as to be formed in a rectangular or line beam.

The region irradiated with the laser beam is the portion for forming the driver circuit for driving each pixel, for example. Only the necessary portions are successively irradiated as the stage 202 is moved and the polycrystalline silicon thin ,film substrate 201 is scanned. At this time, each optical lens barrel 203, 203', 203" is controlled, using an auto focusing mechanism (not shown), by the independent movement in the Z direction of the adjustment stage 204, whereon each optical lens barrel 203, 203', 203" is loaded, so that all of the objective lenses have a constant physical relationship ,to the surface of the substrate 201.

Figure 22A:
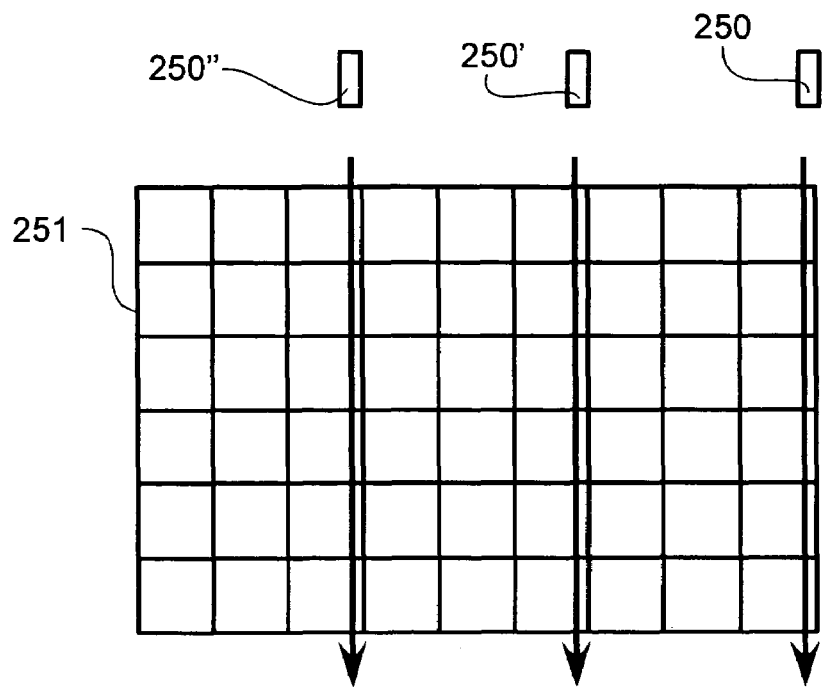
FIGS. 22A and 22B are diagrams of a substrate, illustrating the scanning method used in the laser annealing method relating to another embodiment.

When a large number of small panels are arrayed on a single substrate, annealing can be performed for all panels by performing annealing the every several panels, moving the substrate by a distance of one panel, and repeating the annealing procedures once more. Specifically, FIG. 22A shows the case where nine rows of panels are formed on the substrate 251 and annealed with three optical lens barrels. In this example, annealing is performed every three rows from the right side of the substrate 251 with the three optical lens barrels 250, 250', 250".

Figure 22B:
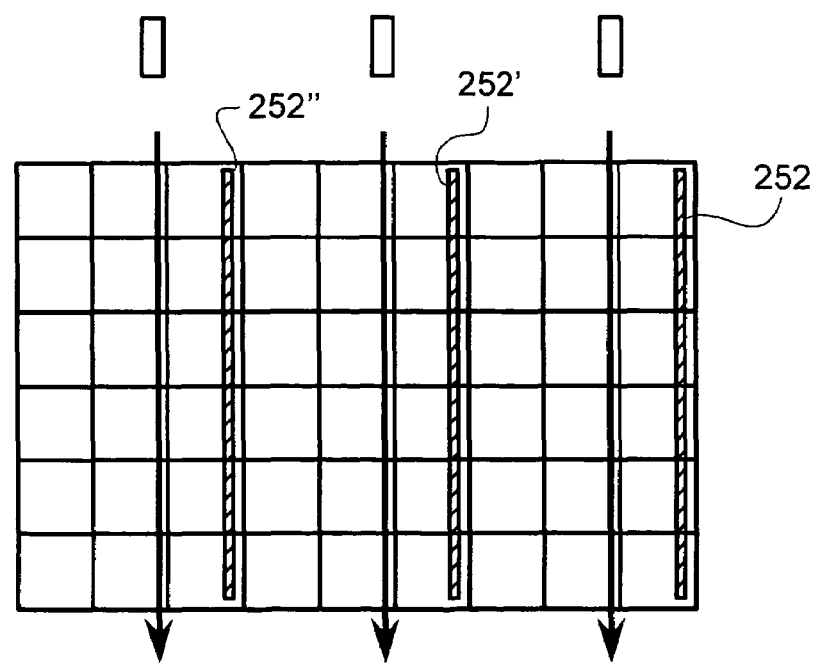

When annealing is finished for the, fourth, and seventh rows of panels and the melted and re-crystallized regions 252, 252', 252" are formed, then the substrate 251 is moved to the right by one row, or the set of optical lens barrels 250, 250', 250" are moved to the left by one row, as shown in FIG. 22B, and then the second, fifth, and eighth rows of panels are annealed. After being further moved by a distance of one panel in the same way, annealing of the third, sixth, and ninth rows of panels is performed, and annealing of the substrate 251 is ended. As necessary, in the case of scanning at right angles to the scanning direction shown in the drawing, the substrate 251 may be rotated 90 degrees, the widthwise and lengthwise direction of the laser beam switched, and the scanning direction changed.

Figure 23A:
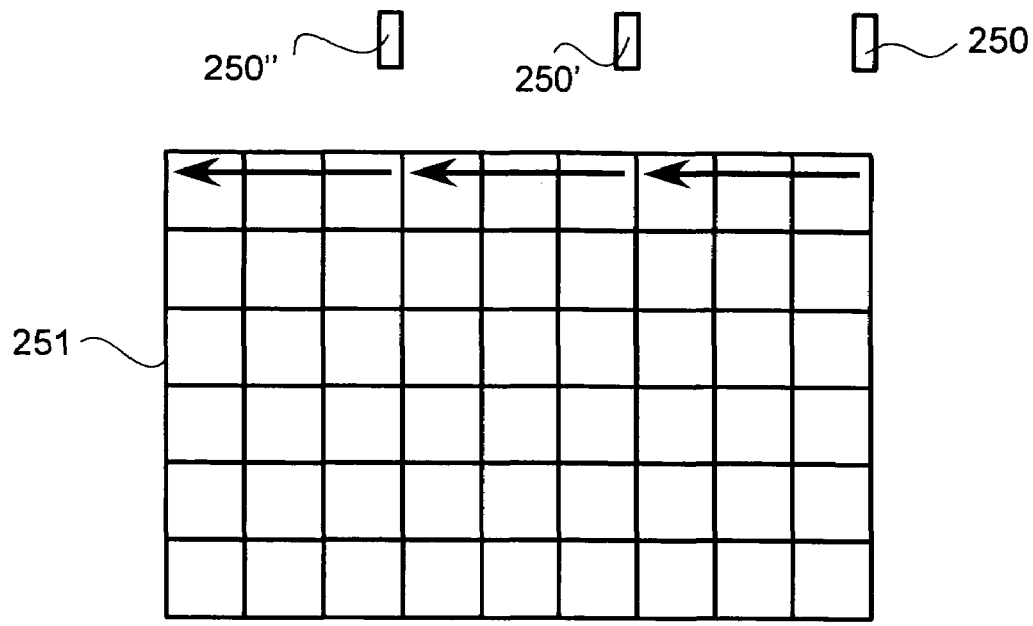
FIGS. 23A and 23B are diagrams of a substrate, illustrating the scanning method used in the laser annealing method relating to another embodiment.
Figure 23B:
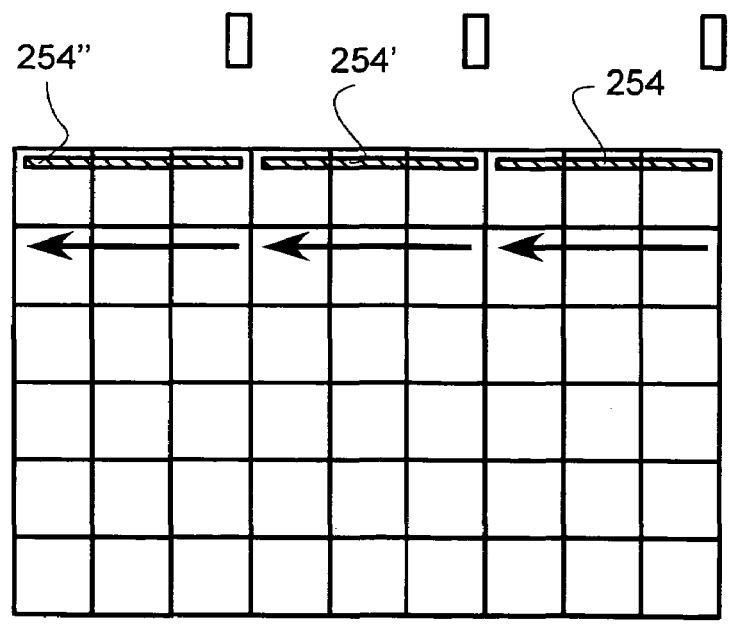

In the case of changing the scanning direction, as shown in FIG. 23A, three panels in the first column of panels are annealed from the right of the substrate 251 with each of the optical lens barrels 250, 250', 250", and the melted and re-crystallized regions 254, 254', 254" are formed. Next, as shown in FIG. 23B, the stage or the optical lens barrels are moved by a distance of one panel in a direction perpendicular to the scanning direction, and three panels in the second column of panels are annealed. This procedure is repeated as many times as necessary, until all panels are annealed, and then the process is ended.

As explained with reference to FIG. 15, the polycrystalline silicon film formed on the substrate 201 is an aggregate of fine crystal grains of one micron or less (several hundred nanometers). When the laser beam is radiated on this fine crystal grain aggregate, the fine crystal grains outside the laser irradiated region remain in their present state, but the fine crystal grains within the laser irradiated region are melted. Thereafter, crystals having the crystal orientation of seed crystals grow in the melted silicon film, with the seed crystals being the remaining crystal grains at the periphery of the melted region.

Because the growth speed of crystal grains at this time varies depending on the crystal orientation, only those crystal grains having a crystal orientation with the fastest growth speed ultimately remain. Specifically, as shown in FIG. 16, the crystal grain 122, having a crystal orientation with a slow growth speed, is suppressed by the growth of crystal grains having a crystal orientation with a faster growth speed, and the crystal growth is stopped. Also, crystal grains 123 and 124, having a crystal orientation with a moderate growth speed continue to grow, but are suppressed by the growth of crystal grains 125, 126, and 127 which have a high growth speed, and before long, their formation stops. Finally, only crystal grains 125, 126, and 127 having a crystal orientation with the fast growth speed continue to grow.

These crystal grains 125, 126, and 127 which continue to grow to the end are individual crystal grains in a strict sense, but have mostly the same crystal orientation. Thus, the melted and re-crystallized portion can effectively be viewed as a single crystal. Specifically, as shown in FIG. 13C, only the part of the polycrystalline silicon thin film 103 that is irradiated with the laser beam 105 is annealed like an island and is in a polycrystalline state in a strict sense. However, regions 106 having a nearly single crystal character are formed.

By repeating these procedures, while scanning the substrate 201 and successively radiating the laser beam on portions requiring annealing, regions to form a transistor of a driver circuit can all be converted to regions having a nearly single crystal character. Furthermore, because the crystal grains grow in a uniform direction in the regions having a nearly single crystal character, as shown in FIG. 16, the flow of current across the crystal grain boundaries can be avoided by matching the direction in which current flows with the direction of crystal grain growth when the transistor is formed.

The direction in which the crystal grains grow can be controlled by the energy density distribution of the radiated laser beam and the scanning direction of the laser beam (actually, the scanning direction of the stage). Specifically, when a slope is provided to the energy density distribution, crystallization begins from the place where the energy density is low (low temperature side) and the crystals grow towards the place where the energy density is high (high temperature side).

Also, the irradiated region moves because the laser beam is scanned, and the drop in temperature begins from the portion which is separated from the irradiated region. Therefore, crystallization begins and crystals grow in the scanning direction of the laser beam. With the present embodiment, crystal grains can be attained which grow greater than the 1 micrometer crystal grain sizes obtained from annealing with an excimer laser in the crosswise direction, and which grow to 10 micrometers or greater in the lengthwise direction. Also, crystal grains of 10 micrometers or greater can be attained.

In the laser irradiated region 301, as shown in FIG. 19, portions constituted only of crystal grains with a high growth speed may be positioned to become the active layers (active regions) 302, 303 of a driving transistor. Through an impurity implantation process and a photo-etching process, portions outside of the active regions 302, 303 are removed. Using a photo-resist process, as shown in FIG. 20, a gate electrode 305 over a gate insulating film, a source electrode 306 and a drain electrode 307 having an ohmic connection are formed, and the transistor is completed.

Crystal grain boundaries 304, 304' are present in the active region 303. However, because current flows between the source electrode 306 and drain electrode 307, current does not cross the crystal grain boundaries 304, 304', and a mobility substantially equivalent to the case of a single crystal is attained. Specifically, the mobility of the melted and re-crystallized portion can be improved to double or more than that of the polycrystalline silicon thin film which only underwent excimer laser annealing. Thereby, a liquid crystal driver circuit which can drive at high speeds can be formed on the TFT device.

Moreover, the transistor shown in FIG. 20 is only one example, and the present invention is not limited thereto. The transistors can have various different structures, but it is clearly possible to form transistors having various structures which do not depart from the substance of the present invention.

On the other hand, pixel switching transistors are formed in the region of the polycrystalline silicon thin film 103 which only underwent annealing with an excimer laser. Specifically, a TFT device is completed through photo-resist processes, such as gate insulating film formation, gate electrode formation, impurities implantation, activation of implanted regions, source and drain electrode formation, and passivation film formation, based on the alignment marks or on the origin coordinates calculated from the alignment marks. The alignment marks formed by laser processing as alignment marks for the photo-resist process are used for positioning in at least one photo-resist process. Thereafter, newly formed alignment marks may be used in the above-mentioned photo-resist processes.

Afterwards, through an LCD (panel) process for forming an orientation film on the completed TFT device, and laying a color filter and sealing liquid crystal material therein on the TFT device through a rubbing process, and a module process for placement of the substrate in a chassis together with a back light or the like, a liquid crystal display device having a high-speed driver circuit formed on the glass substrate is completed (a so-called system on panel or system in display).

As explained above, the laser annealing apparatus and laser annealing method of the present invention have the effects of being able to cause crystal grains of a amorphous or polycrystalline silicon thin film to grow in the desired direction, to convert such a film to a polycrystalline silicon thin film comprising crystal grains of a size greater than 10 microns, and to greatly improve the mobility of the polycrystalline silicon thin film, by radiating a laser beam without influence from interference, having a suitable energy density distribution for annealing the irradiated portion, and having the optimal pulse duration and a suitable temporal energy change for annealing.

Also, the TFT device of the present invention has the effects of making possible the creation of a high speed driving circuit on a substrate and the realization of a so-called system on panel or system in display.

While we have shown and described several embodiments in accordance with our invention, it should be understood that the disclosed embodiments are susceptible of changes and modifications without departing from the scope of the invention. Therefore, we do not intend to be bound by the details shown and described herein, but intend to cover all such changes and modifications that fall within the ambit of the appended claims.

What is claimed is:

1. A method of manufacturing a display device, comprising:
    irradiating an amorphous semiconductor film formed on a substrate with an excimer laser beam to convert the amorphous semiconductor film into a polycrystalline semiconductor film; and
    irradiating predetermined areas of the polycrystalline semiconductor film intermittently with a continuous wave laser beam while a position of the substrate with respect to the continuous wave laser beam is scanned, crystal grains larger than those of the polycrystalline semiconductor film other than the predetermined areas are formed in each of the predetermined areas locally in the polycrystalline semiconductor film,
    wherein first thin film transistors are formed in the predetermined areas while second thin film transistors are formed in the polycrystalline semiconductor film other than the predetermined areas thereof.

2. A method of manufacturing the display device, according to claim 1,
    wherein the display device has a pixel portion and a drive circuit portion, and the second thin film transistors are formed in the pixel portion.

3. A method of manufacturing the display device, according to claim 1,
    wherein the display device has a pixel portion and a drive circuit portion, and the first thin film transistors are formed in the drive circuit portion.

4. A method of manufacturing the display device, according to claim 1,
    wherein the continuous wave laser beam utilized in the irradiating of the predetermined areas of the polycrystalline semiconductor film intermittently therewith is modulated in terms of time by an EO-modulator.

5. A method of manufacturing the display device, according to claim 1, wherein the crystal grains in the predetermined area are grown along a direction of scanning the position of the substrate with respect to the continuous wave laser beam.

6. A method of manufacturing a display device, comprising:
    converting an amorphous semiconductor film formed on a substrate into a polycrystalline semiconductor film by irradiating the amorphous semiconductor film with an excimer laser beam;
    forming recrystallized regions in the polycrystalline semiconductor film by irradiating the polycrystalline semiconductor film with a continuous wave laser beam while scanning a position of the substrate with respect to the continuous wave laser beam, each of the re-crystallized regions includes crystal grains larger in comparison with those of the rest of the polycrystalline semiconductor film not irradiated with the continuous wave laser beam; and
    forming first thin film transistors in the re-crystallized regions and second thin film transistors in the rest of the polycrystalline semiconductor film not irradiated with the continuous wave laser beam,
    wherein the polycrystalline semiconductor film is irradiated intermittently with the continuous wave laser beam in the forming of the re-crystallized regions, not to irradiate a potion of the polycrystalline semiconductor film lying between the re-crystallized regions with the continuous wave laser beam.

7. A method of manufacturing the display device, according to claim 6,
    wherein the display device has a pixel portion and a drive circuit portion each arranged in a surface of the substrate, and the second thin film transistors are formed in the pixel portion.

8. A method of manufacturing the display device, according to claim 6,
    wherein the display device has a pixel portion and a drive circuit portion each arranged in a surface of the substrate, and the first thin film transistors are formed in the drive circuit portion.

9. A method of manufacturing the display device, according to claim 6,
    wherein in the forming of re-crystallized regions, the continuous wave laser beam is modulated in terms of time by an EO-modulator to irradiate the polycrystalline semiconductor film intermittently therewith.

10. A method of manufacturing the display device, according to claim 6,
    wherein the crystal grains in the re-crystallized region are grown along a direction of scanning the position of the substrate with respect to the continuous wave laser beam.

11. A method of manufacturing a display device, comprising:
    converting a first area of an amorphous semiconductor film formed on a surface of a glass substrate into a polycrystalline semiconductor film by irradiating the first area of the amorphous semiconductor film with a first laser beam;
    forming alignment marks by irradiating a plurality of areas of the amorphous semiconductor film other than the first area with a second laser beam;
    converting the polycrystalline semiconductor film in each of second areas within the first area into crystal grains larger than those of the polycrystalline semiconductor film in the rest of the first area other than the second areas by irradiating the polycrystalline semiconductor film in the second areas intermittently with the second laser beam while scanning a position of the glass substrate with respect to the second laser beam relatively; and
    forming first thin film transistors in the second areas and second thin film transistors in the rest of the first area other than the second areas,
    wherein the alignment marks are utilized for positioning of the glass substrate in a photo-resist process following the forming of the alignment marks.

12. A method of manufacturing the display device, according to claim 11,
    wherein the display device has a pixel portion and a drive circuit portion each arranged in the surface of the glass substrate, and the second thin film transistors are formed in the pixel portion.

13. A method of manufacturing the display device, according to claim 11,
wherein the display device has a pixel portion and a drive circuit portion each arranged in the surface of the glass substrate, and the first thin film transistors are formed in the drive circuit portion.

14. A method of manufacturing the display device, according to claim 11,
wherein an excimer laser is utilized for producing the first laser beam.

15. A method of manufacturing the display device, according to claim 11,
wherein a continuous wave laser beam is utilized for the intermittent irradiation with the second laser beam, intensity of the continuous wave laser beam is modulated in terms of time by an EO-modulator.

16. A method of manufacturing the display device, according to claim 11,
wherein the crystal grains in the each of second areas are grown along a direction of the relative scanning the position of the substrate with respect to the second wave laser beam during the converting of the polycrystalline semiconductor film in the each of the second areas into the crystal grains.

17. A method of manufacturing the display device, according to claim 11,
wherein an insulating film is interposed between the surface of the glass substrate and the amorphous semiconductor film formed thereon and converted into the polycrystalline semiconductor film.

* * * * *